(12) United States Patent
Kurogi

(10) Patent No.: US 10,971,469 B2
(45) Date of Patent: Apr. 6, 2021

(54) SEMICONDUCTOR DEVICE INCLUDING VARIOUS PERIPHERAL AREAS HAVING DIFFERENT THICKNESSES

(71) Applicant: LAPIS SEMICONDUCTOR CO., LTD, Yokohama (JP)

(72) Inventor: Kohei Kurogi, Miyazaki (JP)

(73) Assignee: LAPIS Semiconductor Co., Ltd., Yokohama (JP)

( * ) Notice: Subject to any disclaimer, the term of this patent is extended or adjusted under 35 U.S.C. 154(b) by 0 days.

(21) Appl. No.: 16/387,561

(22) Filed: Apr. 18, 2019

(65) Prior Publication Data

US 2019/0333889 A1  Oct. 31, 2019

(30) Foreign Application Priority Data

Apr. 25, 2018 (JP) .............................. JP2018-084420

(51) Int. Cl.
| | |
|---|---|
| *H01L 21/56* | (2006.01) |
| *H01L 23/522* | (2006.01) |
| *H01L 25/065* | (2006.01) |
| *H01L 23/00* | (2006.01) |

(52) U.S. Cl.
CPC ............ *H01L 24/32* (2013.01); *H01L 21/561* (2013.01); *H01L 21/563* (2013.01); *H01L 23/5226* (2013.01); *H01L 24/17* (2013.01); *H01L 24/81* (2013.01); *H01L 24/83* (2013.01); *H01L 24/96* (2013.01); *H01L 25/0657* (2013.01)

(58) Field of Classification Search
CPC .. H01L 21/561; H01L 21/563; H01L 25/0567
See application file for complete search history.

(56) References Cited

U.S. PATENT DOCUMENTS

| | | | | |
|---|---|---|---|---|
| 2003/0127722 | A1* | 7/2003 | Nakaoka ................. | H01L 24/97 257/686 |
| 2011/0248400 | A1* | 10/2011 | Onodera ................. | H01L 24/94 257/737 |
| 2014/0322866 | A1* | 10/2014 | Chen .................... | H01L 25/0652 438/108 |

FOREIGN PATENT DOCUMENTS

JP    2008218926    9/2008

* cited by examiner

*Primary Examiner* — Matthew E. Gordon
(74) *Attorney, Agent, or Firm* — JCIPRNET

(57) ABSTRACT

Reliability of joining between semiconductor chips is improved by promoting filling of a sealing resin into a gap formed between the semiconductor chips.
A semiconductor device includes: a first semiconductor chip, which has a plurality of first electrodes on a surface; a second semiconductor chip, which is disposed to be separated by a gap from the surface of the first semiconductor chip, and which includes an inner peripheral area that has a plurality of second electrodes connected to each of the first electrodes on a surface and an outer peripheral area that surrounds the inner peripheral area and has a thickness thinner than the thickness of the inner peripheral area; and a sealing resin, which is respectively filled between the surface of the first semiconductor chip and the inner peripheral area, and between the surface of the first semiconductor chip and the outer peripheral area.

7 Claims, 21 Drawing Sheets

SEMICONDUCTOR DEVICE INCLUDING VARIOUS PERIPHERAL AREAS HAVING DIFFERENT THICKNESSES

CROSS-REFERENCE TO RELATED APPLICATION

This application claims the priority of Japan patent application serial no. 2018-084420, filed on Apr. 25, 2018. The entirety of the above-mentioned patent application is hereby incorporated by reference herein and made a part of this specification.

BACKGROUND

Technical Field

The disclosure relates to a semiconductor device and a manufacturing method of the semiconductor device.

Related Art

WL-CSP (Wafer level Chip Size Package) is a packaging technology of semiconductor device which performs rewiring, electrode formation, resin sealing and dicing by a wafer process. In addition, a multi-chip WL-CSP including a plurality of semiconductor chips that are laminated is also known.

In the multi-chip WL-CSP, a plane size of a package is substantially the same as the plane size of any semiconductor chip accommodated in the package, and a height of the package is substantially the same as the height of a laminate of the plurality of semiconductor chips accommodated in the package, and thus high performance of the semiconductor device is achieved and the package size can be reduced. In addition, since connection between the plurality of semiconductor chips is performed by flip-chip bonding, wire bonding is unnecessary and performance can be improved, for example, delay of communication between the semiconductor chips is suppressed.

In patent literature 1, a manufacturing method of semiconductor device is disclosed, which includes a process for forming columnar electrodes on a semiconductor wafer, a process for performing flip-chip bonding on a second semiconductor chip on the semiconductor wafer, a process for forming a sealing portion that seals to cover the columnar electrodes and the second semiconductor chip on the semiconductor wafer, and a process for grinding the sealing portion and the second semiconductor chip so that upper surfaces of the columnar electrodes and an upper surface of the second semiconductor chip are exposed.

[Patent literature 1]Japanese Patent Application Laid-Open (JP-A) No. 2008-218926

One problem of the multi-chip WL-CSP is to improve reliability in the joining between the semiconductor chips.

As a method for achieving the improvement of reliability in the joining between the semiconductor chips, the method is considered in which a sealing resin is filled into a gap formed between the semiconductor chips and is cured, thereby fixing a joining portion of the semiconductor chips.

However, since the sealing resin having a relatively high viscosity, it is not easy to thoroughly fill the sealing resin into the gap formed between the semiconductor chips. When a portion which is not filled with the sealing resin is generated in the gap formed between the semiconductor chips, the reliability in the joining between the semiconductor chips is reduced.

SUMMARY

The disclosure improves the reliability in the joining between the semiconductor chips by promoting the filling of the sealing resin into the gap formed between the semiconductor chips.

A semiconductor device of the disclosure includes: a first semiconductor chip, which has a plurality of first electrodes on a surface; a second semiconductor chip, which is disposed to be separated by a gap from the surface of the first semiconductor chip, and which includes an inner peripheral area that has a plurality of second electrodes connected to each of the first electrodes on a surface and an outer peripheral area that surrounds the inner peripheral area and has a thickness thinner than the thickness of the inner peripheral area; and a sealing resin, which is respectively filled between the surface of the first semiconductor chip and the inner peripheral area, and between the surface of the first semiconductor chip and the outer peripheral area.

A manufacturing method of semiconductor device of the disclosure includes: a process for preparing a first semiconductor chip which has a plurality of first electrodes on a surface; a process for preparing a second semiconductor chip which includes an inner peripheral area that has a plurality of second electrodes on a surface and an outer peripheral area that surrounds the inner peripheral area and has a thickness thinner than the thickness of the inner peripheral area; a process in which the first semiconductor chip and the second semiconductor chip are separated by a gap and laminated, and each of the first electrodes and each of the second electrodes are joined; and a process for filling a sealing resin between the first semiconductor chip and the inner peripheral area, and between the first semiconductor chip and the outer peripheral area.

DESCRIPTION OF THE EMBODIMENTS

Figure 1:
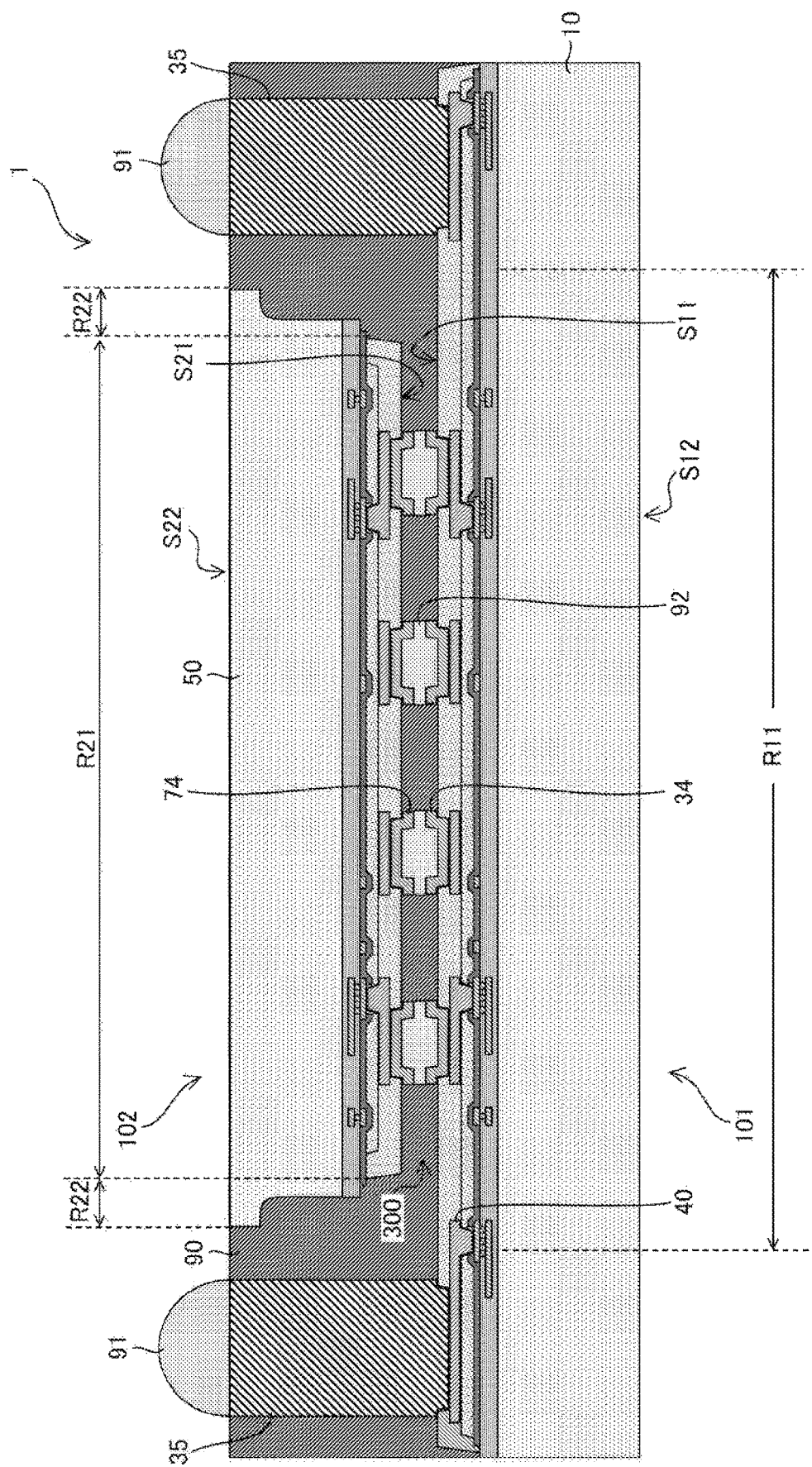
FIG. 1 is a cross-sectional view illustrating one example of a configuration of a semiconductor device of an embodiment of the disclosure.

According to the disclosure, the filling of the sealing resin into the gap formed between the semiconductor chips can be promoted, and reliability in the joining between the semiconductor chips can be improved.

In the following, embodiments of the disclosure are described with reference to the drawings. Besides, in each drawing, the substantially identical or equivalent structural components or portions are denoted by the same reference numerals.

Figure 2:
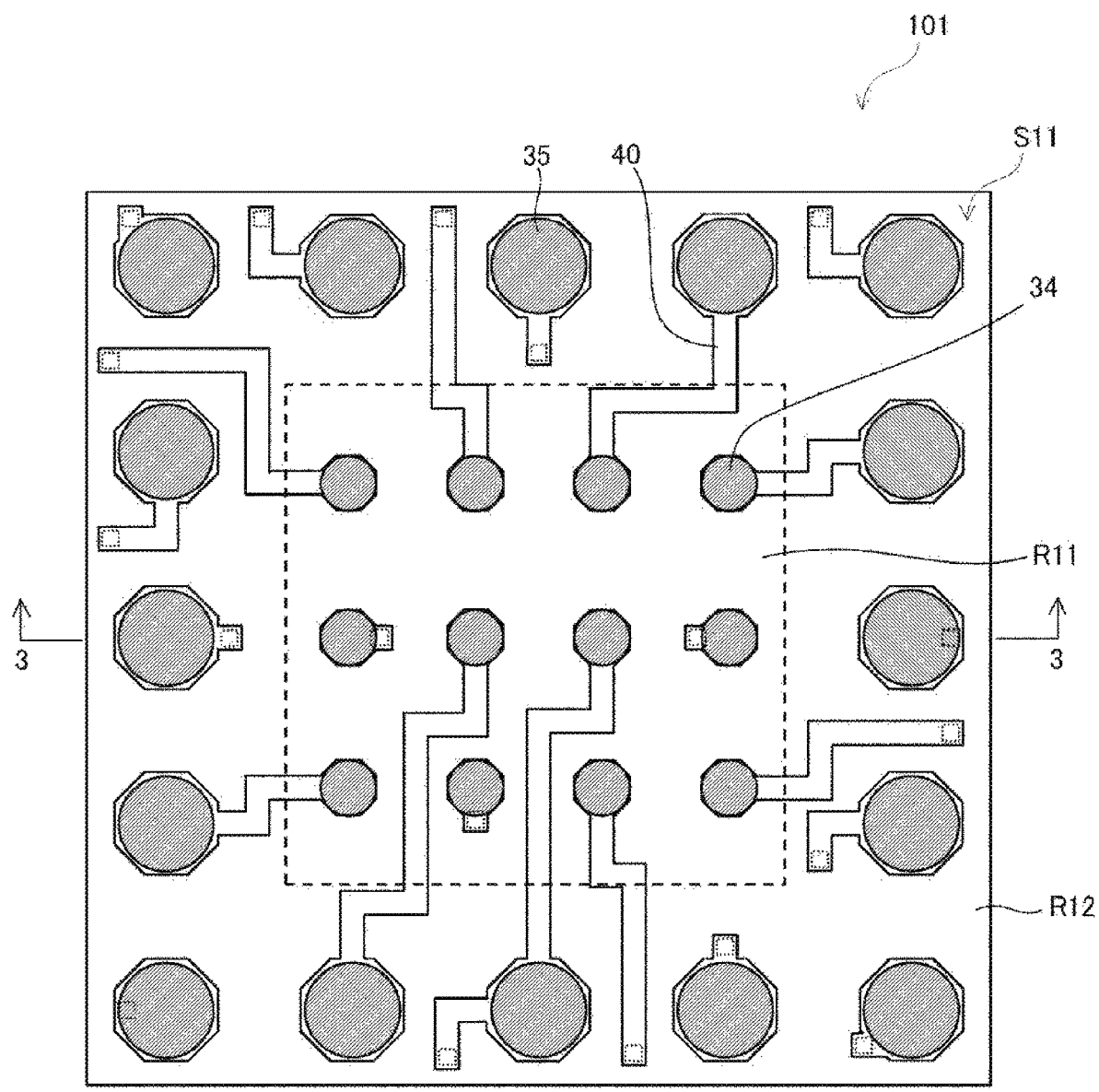
FIG. 2 is a plane view illustrating one example of a configuration of a first semiconductor chip of the embodiment of the disclosure.
Figure 3:
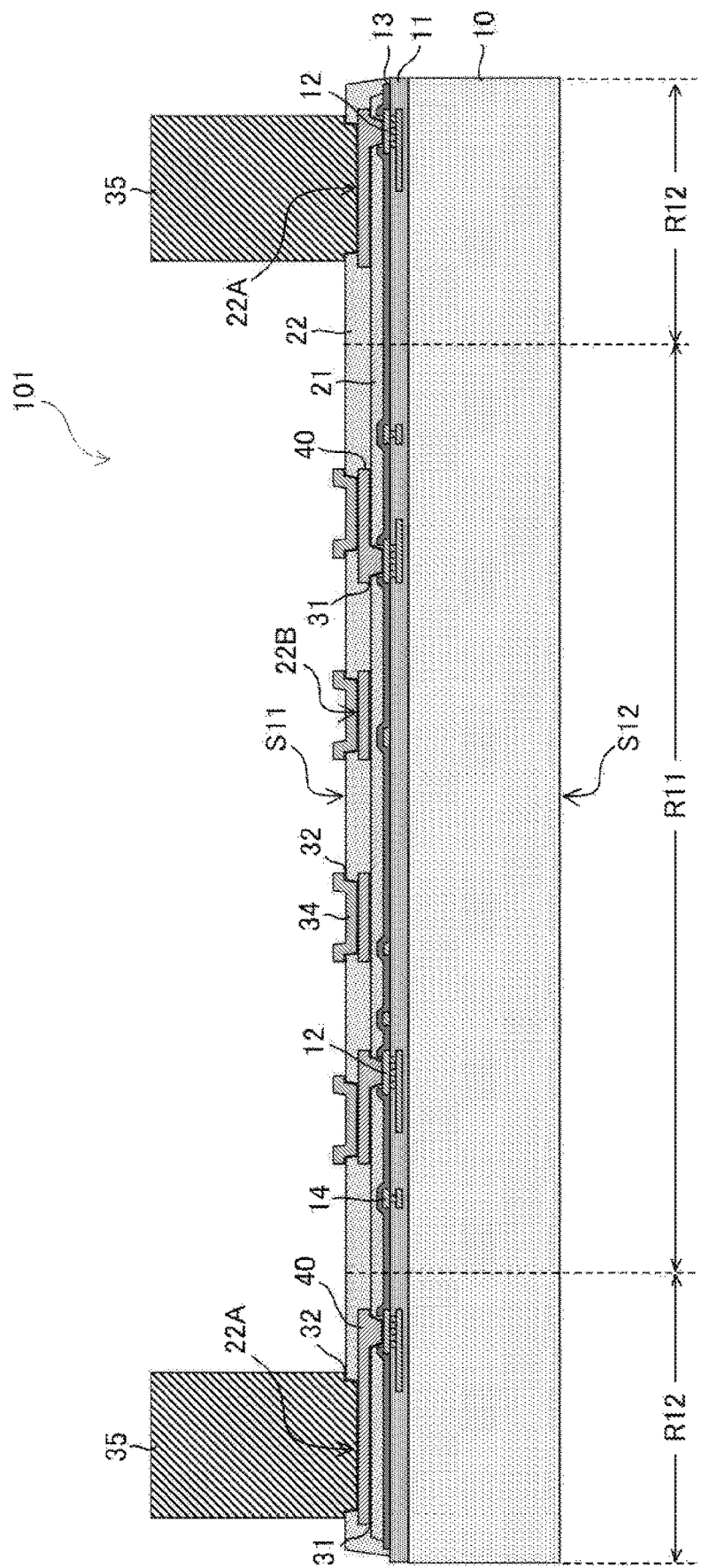
FIG. 3 is a cross-sectional view taken along line 3-3 in FIG. 2.
Figure 4:
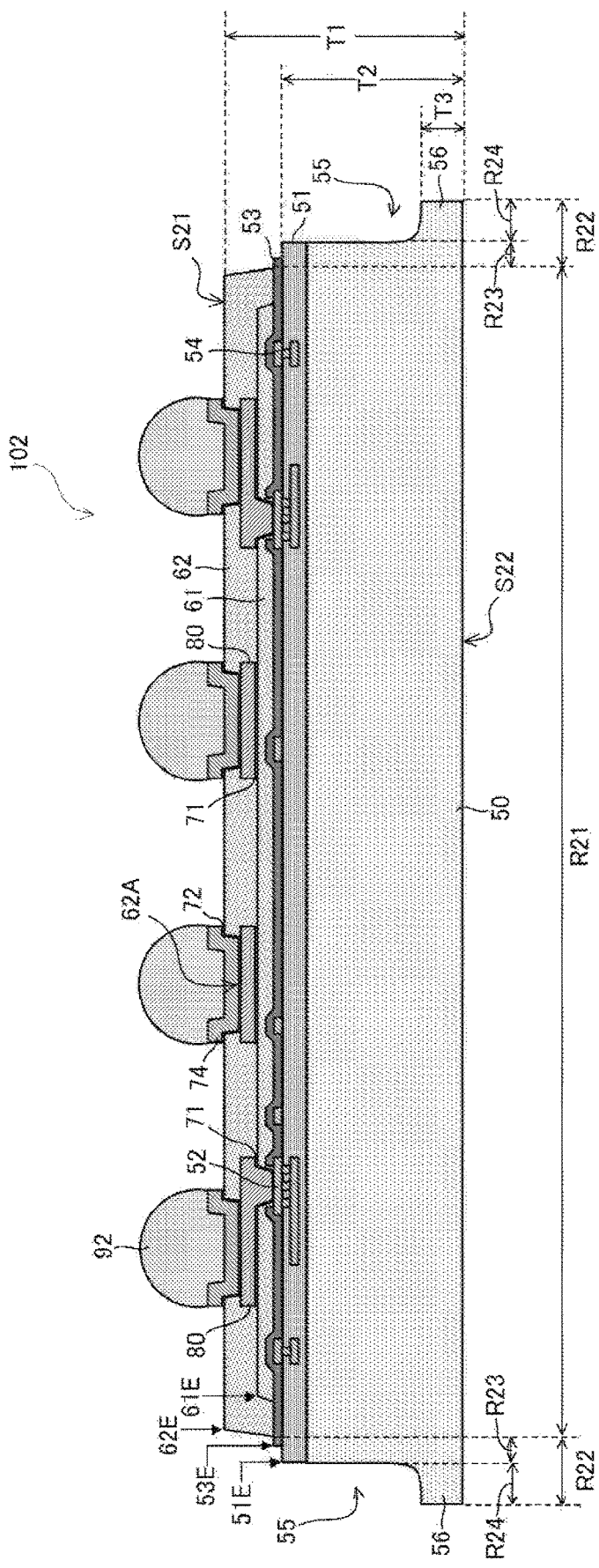
FIG. 4 is a cross-sectional view illustrating one example of a configuration of a second semiconductor chip of the embodiment of the disclosure.

FIG. 1 is a cross-sectional view of an entire configuration of a semiconductor device 1 of an embodiment of the disclosure. FIG. 2 is a plane view in which a first semiconductor chip 101 constituting the semiconductor device 1 is viewed from an electrode formation surface S11 side. FIG. 3 is a cross-sectional view taken along line 3-3 in FIG. 2. FIG. 4 is a cross-sectional view of a second semiconductor chip 102 constituting the semiconductor device 1.

The semiconductor device 1 includes the first semiconductor chip 101, the second semiconductor chip 102 laminated on the first semiconductor chip 101, and a sealing resin 90 sealing the first semiconductor chip 101 and the second semiconductor chip 102. A package form of the semiconductor device 1 has a multi-chip WL-CSP form. That is, in the semiconductor device 1, a plane size of the package is substantially the same as the plane size of the first semiconductor chip 101, and a height of the package is substantially the same as the height of the laminate of the first semiconductor chip 101 and the second semiconductor chip 102.

In the following, a configuration of the first semiconductor chip 101 is described with reference to FIG. 2 and FIG. 3. On a surface of a semiconductor substrate 10 constituting the first semiconductor chip 101, circuit elements (not shown) such as a transistor, a resistance element, a capacitor and the like are formed. The surface of the semiconductor substrate 10 is covered by an interlayer insulation film 11 made of an insulator of $SiO_2$ and the like. On a surface of the interlayer insulation film 11, chip electrodes 12 connected to the circuit elements formed on the semiconductor substrate 10 and a passivation film (protective film) 13 including opening portions from which surfaces of the chip electrodes 12 are partially exposed are arranged. The first semiconductor chip 101 has a plurality of wire layers which are electrically isolated from one another by the interlayer insulation film 11, and an uppermost-layer wire 14 arranged on the uppermost layer within the plurality of wire layers is arranged on the same layer as the chip electrodes 12 (that is, on the surface of the interlayer insulation film 11). The uppermost-layer wire 14 is covered by the passivation film 13.

A surface of the passivation film 13 is covered by a lower-layer insulation film 21 having a thickness of about 10 μm, which is configured by a photosensitive organic insulation member such as polyimide, PBO (polybenzoxazole) or the like. The opening portions from which the surfaces of the chip electrodes 12 are partially exposed are arranged on the lower-layer insulation film 21.

On a surface of the lower-layer insulation film 21, a rewire 40 is arranged via a first UBM (Under Bump Metallurgy) film 31. The first UBM film 31 is configured by a laminated film including a Ti film and a Cu film for example. The Ti film functions as an adhesion layer for improving adhesion between the lower-layer insulation film 21 and the rewire 40. The Cu film functions as a seed layer for forming the rewire 40 by an electrolytic plating method. The rewire 40 is configured by a conductor of Cu and the like for example, and is connected to the chip electrodes 12 via the first UBM film 31 in the opening portions of the lower-layer insulation film 21. The Cu film constituting the first UBM film 31 is taken into the Cu constituting the rewire 40. Therefore, a structure in which the Ti film functioning as the adhesion layer is interposed between the lower-layer insulation film 21 and the rewire 40 is obtained. A thickness of the rewire 40 including the Cu film constituting the first UBM film 31 is, for example, about 5 μm, and the thickness of the Ti film constituting the first UBM film 31 is, for example, about 150 nm.

The surfaces of the lower-layer insulation film 21 and the rewire 40 are covered by an upper-layer insulation film 22 which is configured by a photosensitive organic insulation member such as polyimide, PBO or the like. The thickness of the portion of the upper-layer insulation film 22 which covers the surface of the rewire 40 is, for example, about 5 μm.

Here, the first semiconductor chip 101 includes an inner peripheral area R11 and an outer peripheral area R12 surrounding the inner peripheral area R11. The upper-layer insulation film 22 includes opening portions 22A from which the rewire 40 is partially exposed at formation positions of the columnar electrodes 35 in the outer peripheral area R12, and includes opening portions 22B from which the rewire 40 is partially exposed at formation positions of inter-chip joining electrodes 34 in the inner peripheral area R11.

A plurality of inter-chip joining electrodes 34 having a thickness of about 5 μm are arranged in the inner peripheral area R11. Each inter-chip joining electrode 34 is arranged at a position containing each opening portion 22B of the upper-layer insulation film 22 in a plane view, and is connected to a portion of the rewire 40 exposed in the opening portion 22B via a second UBM film 32. The inter-chip joining electrodes 34 are configured by a metal that does not diffuse into a solder containing SnAg for example. As a material of the inter-chip joining electrodes 34, for example, Ni can be used suitably.

In the outer peripheral area R12, a plurality of columnar electrodes 35 are arranged to surround each of the inter-chip joining electrodes 34. Each columnar electrode 35 is arranged at a position containing each opening portion 22A of the upper-layer insulation film 22 in a plane view, and is connected to a portion of the rewire 40 exposed in the opening portion 22A via the second UBM film 32. As the material of the columnar electrodes 35, Cu that is easily processed can be used suitably. The columnar electrodes 35 have cylindrical shapes for example. Besides, as shown in FIG. 2, a portion of the columnar electrodes 35 may be connected to the inter-chip joining electrodes 34 via the rewire 40. A height from the surface of the upper-layer insulation film 22 to the top of the columnar electrodes 35 is, for example, 150-250 μm, and in an alternative embodiment is about 200 μm.

The second UBM film 32 is arranged between the rewire 40 and the columnar electrodes 35, and between the rewire 40 and the inter-chip joining electrodes 34. Similar to the first UBM film 31, the second UBM film 32 is configured by a laminated film which includes a Ti film that functions as an adhesion layer and has a thickness of about 150 nm and a Cu film that functions as a seed layer and has a thickness of about 300 nm. The Cu film constituting the second UBM film 32 is taken into the Cu constituting the columnar electrodes 35. Therefore, a structure in which the Ti film functioning as the adhesion layer is interposed between the columnar electrodes 35 and the rewire 40 is obtained. On the other hand, a structure in which the laminated film including the Ti film and the Cu film is interposed between the inter-chip joining electrodes 34 and the rewire 40 is obtained.

Next, a configuration of the second semiconductor chip 102 is described with reference to FIG. 4. On a surface of a semiconductor substrate 50 constituting the second semiconductor chip 102, circuit elements (not shown) such as a transistor, a resistance element, a capacitor and the like are formed. The surface of the semiconductor substrate 50 is covered by an interlayer insulation film 51 made of an insulator of $SiO_2$ and the like. On a surface of the interlayer insulation film 51, chip electrodes 52 connected to the circuit elements formed on the semiconductor substrate 50 and a passivation film 53 including opening portions from which surfaces of the chip electrodes 52 are partially exposed are arranged. The second semiconductor chip 102 has a plurality of wire layers which are electrically isolated from one another by the interlayer insulation film 51, and an uppermost-layer wire 54 arranged on the uppermost layer within the plurality of wire layers is arranged on the same layer as the chip electrodes 52 (that is, on the surface of the interlayer insulation film 51). The uppermost-layer wire 54 is covered by the passivation film 53.

A surface of the passivation film 53 is covered by a lower-layer insulation film 61 having a thickness of about 10 μm, which is configured by a photosensitive organic insulation member such as polyimide, PBO or the like. The opening portions from which the surfaces of the chip electrodes 52 are partially exposed are arranged on the lower-layer insulation film 61.

On a surface of the lower-layer insulation film 61, a rewire 80 is arranged via a third UBM film 71. The third UBM film 71 is configured by a laminated film including a Ti film and a Cu film for example. The Ti film functions as an adhesion layer for improving adhesion between the lower-layer insulation film 61 and the rewire 80. The Cu film functions as a seed layer for forming the rewire 80 by the electrolytic plating method. The rewire 80 is configured by a conductor of Cu and the like for example, and is connected to the chip electrodes 52 via the third UBM film 71 in the opening portions of the lower-layer insulation film 61. The Cu film constituting the third UBM film 71 is taken into the Cu constituting the rewire 80. Therefore, a structure in which the Ti film functioning as the adhesion layer is interposed between the lower-layer insulation film 61 and the rewire 80 is obtained. The thickness of the rewire 80 including the Cu film constituting the third UBM film 71 is, for example, about 5 μm, and the thickness of the Ti film constituting the third UBM film 71 is, for example, about 150 nm.

The surfaces of the lower-layer insulation film 61 and the rewire 80 are covered by an upper-layer insulation film 62 which is configured by a photosensitive organic insulation member such as polyimide, PBO or the like. The thickness of the portion of the upper-layer insulation film 62 which covers the surface of the rewire 80 is, for example, about 5 μm. The upper-layer insulation film 62 includes opening portions 62A from which the rewire 80 is partially exposed at formation positions of inter-chip joining electrodes 74.

The second semiconductor chip 102 includes a plurality of inter-chip joining electrodes 74 having a thickness of about 5 μm. Each inter-chip joining electrode 74 corresponds to each inter-chip joining electrode 34 of the first semiconductor chip 101. Each inter-chip joining electrode 74 is arranged at a position containing each opening portion 62A of the upper-layer insulation film 62 in a plane view, and is connected to a portion of the rewire 80 exposed in the opening portion 62A via a fourth UBM film 72. The inter-chip joining electrodes 74 are configured by a metal that does not diffuse into a solder containing SnAg for example. As the material of the inter-chip joining electrodes 74, for example, Ni can be used suitably.

On the surface of the inter-chip joining electrodes 74, a joining member 92 which is configured by a SnAg solder for example is arranged. In an embodiment, the joining member 92 contains Sn, Ag and Cu and has a ball shape with a diameter of about 65-85 μm and a height of about 60-80 μm.

In the second semiconductor chip 102 of the embodiment, an end portion 53E of the passivation film 53 is disposed closer to an inner peripheral side of the second semiconductor chip 102 than an end portion 51E of the interlayer insulation film 51. An end portion 61E of the lower-layer insulation film 61 is disposed closer to the inner peripheral side of the second semiconductor chip 102 than the end portion 53E of the passivation film 53. An end portion 62E of the upper-layer insulation film 62 is disposed closer to the inner peripheral side of the second semiconductor chip 102 than the end portion 53E of the passivation film 53, and closer to an outer periphery side of the second semiconductor chip 102 than the end portion 61E of the lower-layer insulation film 61. That is, the lower-layer insulation film 61 becomes a structure in which the entire lower-layer insulation film 61 is covered by the upper-layer insulation film 62 and is not exposed from the upper-layer insulation film 62. Besides, the end portion 51E of the interlayer insulation film 51, the end portion 53E of the passivation film 53, the end portion 61E of the lower-layer insulation film 61, and the end portion 62E of the upper-layer insulation film 62 are respectively end portions in a direction parallel to a principal surface of the second semiconductor chip 102.

In addition, the semiconductor substrate 50 constituting the second semiconductor chip 102 includes a concave portion 55 which is concaved to the inner peripheral side of the second semiconductor chip on a side surface intersecting with an electrode formation surface S21 on which the inter-chip joining electrodes 74 are arranged. Accordingly, on a back surface S22 side of the semiconductor substrate 50 on an opposite side of the electrode formation surface S21, projection portions 56 are formed which project farther to the outer periphery side of the second semiconductor chip 102 than the end portion 51E of the interlayer insulation film 51.

Here, a range in which the upper-layer insulation film 62 of the second semiconductor chip 102 extends is defined as an inner peripheral area R21, and an area surrounding the inner peripheral area R21 of the second semiconductor chip 102 is defined as an outer peripheral area R22. Furthermore, a range in the outer peripheral area R22 in which the interlayer insulation film 51 extends is defined as a first outer peripheral area R23, and an area surrounding the first outer peripheral area R23 is defined as an outermost peripheral area R24. The inter-chip joining electrodes 74 are arranged in the inner peripheral area R21.

The second semiconductor chip 102 includes, in the inner peripheral area R21, the semiconductor substrate 50, the interlayer insulation film 51, the lower-layer insulation film 61, and the upper-layer insulation film 62. In the first outer peripheral area R23, the second semiconductor chip 102 does not include the upper-layer insulation film 62 or the lower-layer insulation film 61 but includes the semiconductor substrate 50 and the interlayer insulation film 51. In the outermost peripheral area R24, the second semiconductor chip 102 does not include the interlayer insulation film 51, the lower-layer insulation film 61 or the upper-layer insulation film 62 but includes the semiconductor substrate 50 (the projection portions 56).

A thickness T1 in the inner peripheral area R21 of the second semiconductor chip 102 is equivalent to a distance from a back surface S22 of the semiconductor substrate 50 to the surface of the upper-layer insulation film 62 and is, for example, about 200-250 μm. A thickness T2 in the first outer peripheral area R23 of the second semiconductor chip 102 is equivalent to a distance from the back surface S22 of the semiconductor substrate 50 to the surface of the interlayer insulation film 51 and is, for example, about 180-230 μm. A thickness T3 in the outermost peripheral area R24 of the second semiconductor chip 102 is equivalent to a thickness of the projection portions 56 of the semiconductor substrate 50 and is, for example, about 40-60 μm. Besides, T3<T2<T1 is always established. A depth of the concave portion 55 of the semiconductor substrate 50 in a thickness direction of the semiconductor substrate 50 is, for example, about 120-190 μm.

Accordingly, the thickness of the second semiconductor chip 102 gradually increases from the outer periphery side toward the inner peripheral side. In other words, the second semiconductor chip 102 has a step structure in which a position of the end portion in the direction parallel to the principle surface changes along a thickness direction of the second semiconductor chip 102.

A width in the first outer peripheral area R23 of the second semiconductor chip 102 is equivalent to a distance from an end surface of the concave portion 55 of the semiconductor substrate 50 to the end portion 62E of the upper-layer insulation film 62 and is, for example, about 5-20 μm. A width in the outermost peripheral area R24 of the second semiconductor chip 102 is equivalent to a width of the concave portion 55 of the semiconductor substrate 50 and is, for example, about 15-60 μm.

Next, a configuration of the semiconductor device 1 including the first semiconductor chip 101 and the second semiconductor chip 102 is described with reference to FIG. 1.

The respective inter-chip joining electrodes 34 of the first semiconductor chip 101 and the inter-chip joining electrodes 74 of the second semiconductor chip 102 are joined via the joining member 92. That is, the two chips are joined in a state that the electrode formation surface S11 of the first semiconductor chip 101 and the electrode formation surface S21 of the second semiconductor chip 102 faces each other. Accordingly, the circuit elements (not shown) formed on the semiconductor substrate 50 of the second semiconductor chip 102 are connected to the circuit elements (not shown) formed on the semiconductor substrate 10 of the first semiconductor chip 101, or connected to external connection terminals 91 via the rewire 40 and the columnar electrodes 35.

Between the electrode formation surface S11 of the first semiconductor chip 101 and the electrode formation surface S21 of the second semiconductor chip 102, a gap 300 is formed. A length of the gap 300 is, for example, 50-80 μm, and in an alternative embodiment is 60-70 μm.

In the embodiment, a size of the second semiconductor chip 102 is smaller than the size of the first semiconductor chip 101; the second semiconductor chip 102 is loaded in an area contained in the inner peripheral area R11 of the first semiconductor chip 101, and is surrounded by the plurality of columnar electrodes 35. In the columnar electrodes 35, one end portion is connected to the rewire 40 of the first semiconductor chip 101, and the other end portion (top) reaches the back surface S22 of the second semiconductor chip 102. A distance from the columnar electrodes 35 to the second semiconductor chip 102 in a plane view is, for example, 700 μm or less, and in an alternative embodiment is 500-600 μm.

The sealing resin 90 is arranged on the electrode formation surface S11 side of the first semiconductor chip 101 so that the second semiconductor chip 102 and the columnar electrodes 35 are embedded inside. The sealing resin 90 is respectively filled between the first semiconductor chip 101 and the inner peripheral area R21 of the second semiconductor chip 102 (that is, the gap 300), and between the first semiconductor chip 101 and the outer peripheral area R22 of the second semiconductor chip 102. In addition, the sealing resin 90 is filled between the columnar electrodes 35 and the second semiconductor chip 102. The side surface of the joining member 92 is covered by the sealing resin 90 which is filled into the gap 300 formed between the first semiconductor chip 101 and the second semiconductor chip 102. A thickness from the back surface S12 of the first semiconductor chip 101 to the surface of the sealing resin 90 is, for example, about 350-550 μm, and in an alternative embodiment is 400-500 μm.

The top of the columnar electrodes 35 and the back surface S22 of the second semiconductor chip 102 on the opposite side of the electrode formation surface S21 are exposed from the surface of the sealing resin 90. On the top of the columnar electrodes 35 which are exposed from the surface of the sealing resin 90, the external connection terminals 91 are arranged. The external connection terminals 91 are configured by a SnAg solder for example. The semiconductor device 1 is mounted on a mounting substrate (not shown) via the external connection terminals 91.

Besides, in the embodiment, an aspect in which the back surface S22 of the second semiconductor chip 102 is exposed from the surface of the sealing resin 90 is illustrated, but the back surface S22 of the second semiconductor chip 102 may also be covered by the sealing resin 90. In this case, a thickness of the sealing resin 90 which covers the back surface S22 of the second semiconductor chip is, for example, about 30 μm.

A manufacturing method of the semiconductor device 1 is described below. The manufacturing process of the semiconductor device 1 includes a preparation process of the first semiconductor chip 101, a preparation process of the second semiconductor chip 102, and a packaging process for joining and sealing the first semiconductor chip 101 and the second semiconductor chip 102.

Firstly, the preparation process of the first semiconductor chip 101 is described with reference to FIG. 5A-FIG. 5Q.

Figure 5A:
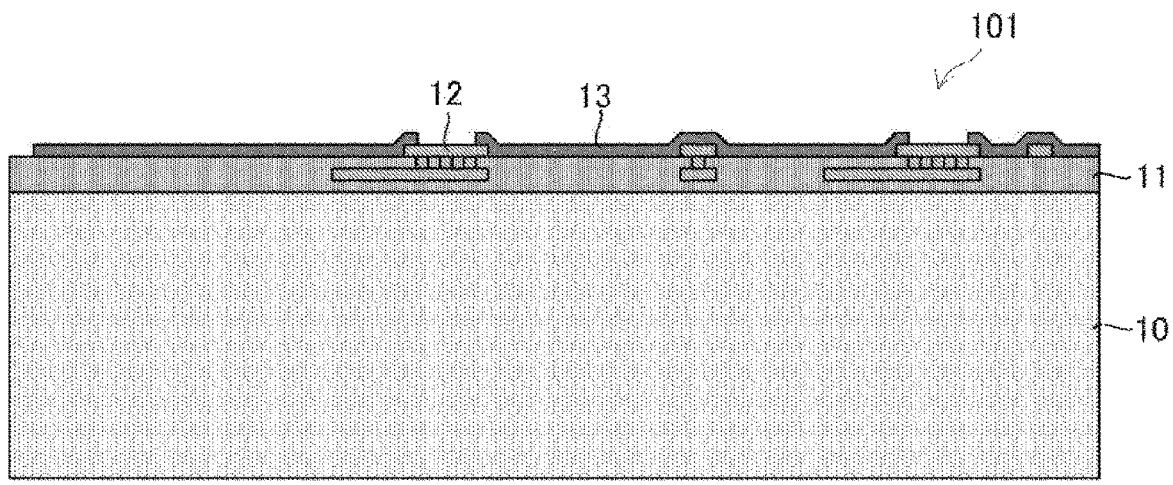
FIG. 5A is a cross-sectional view illustrating one example of a preparation process of the first semiconductor chip of the embodiment of the disclosure.

A semiconductor wafer for which a wafer process of the first semiconductor chip 101 is completed is prepared (FIG. 5A). The wafer process of the first semiconductor chip 101 includes a process for forming circuit elements (not shown) such as a transistor on the semiconductor substrate 10, a process for forming the interlayer insulation film 11 which is configured by an insulator of $SiO_2$ and the like on the surface of the semiconductor substrate 10, a process for forming the chip electrodes 12 on the surface of the interlayer insulation film 11, and a process for forming the passivation film 13 so that the chip electrodes 12 are partially exposed on the surface of the interlayer insulation film 11.

Figure 5B:
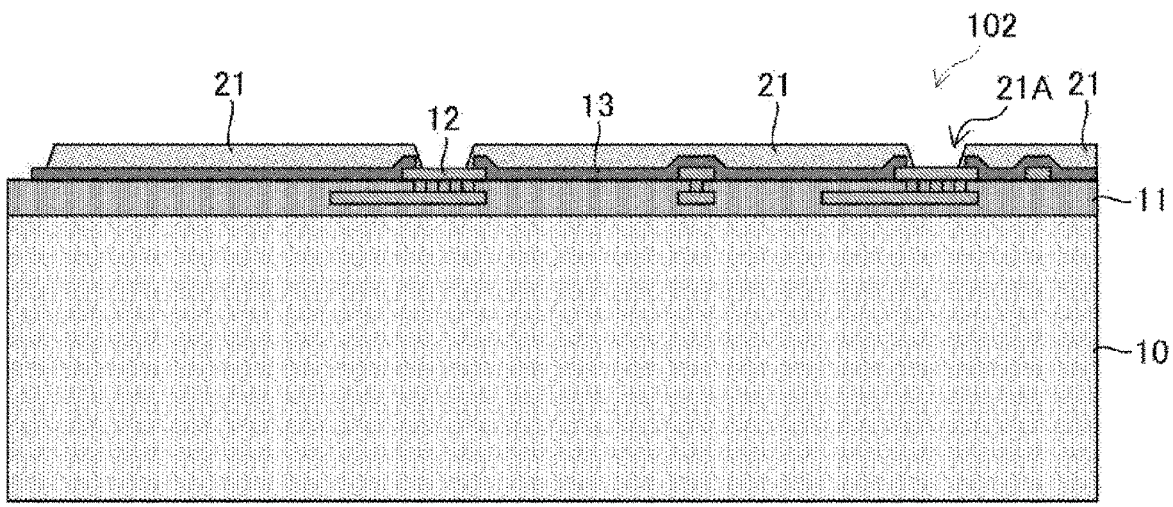
FIG. 5B is a cross-sectional view illustrating one example of the preparation process of the first semiconductor chip of the embodiment of the disclosure.

Next, for example, a spin coating method is used to coat a photosensitive organic insulation member such as polyimide, PBO or the like on the surface of the first semiconductor chip 101, and thereby forms the lower-layer insulation film 21 which covers the passivation film 13 and the surfaces of the chip electrodes 12. Subsequently, by performing an exposure and development treatment on the lower-layer insulation film 21, opening portions 21A from which the surfaces of the chip electrodes 12 are partially exposed are formed on the lower-layer insulation film 21. After that, the lower-layer insulation film 21 is cured by a heat treatment (FIG. 5B).

Figure 5C:
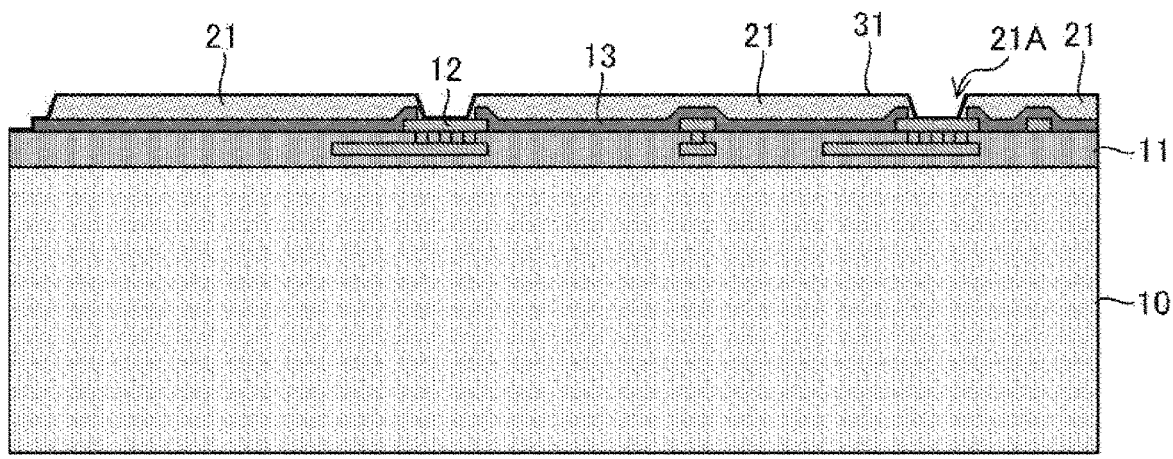
FIG. 5C is a cross-sectional view illustrating one example of the preparation process of the first semiconductor chip of the embodiment of the disclosure.

Next, the first UBM film 31 is formed which covers the surface of the lower-layer insulation film 21 and the surfaces of the chip electrodes 12 exposed in the opening portions 21A (FIG. 5C). The first UBM film 31 is formed, for example, by sequentially forming a Ti film and a Cu film using a sputtering method. The Ti film functions as an adhesion layer for improving adhesion between the lower-layer insulation film 21 and the rewire 40. The Cu film functions as a seed layer for forming the rewire 40 by the electrolytic plating method.

Figure 5D:
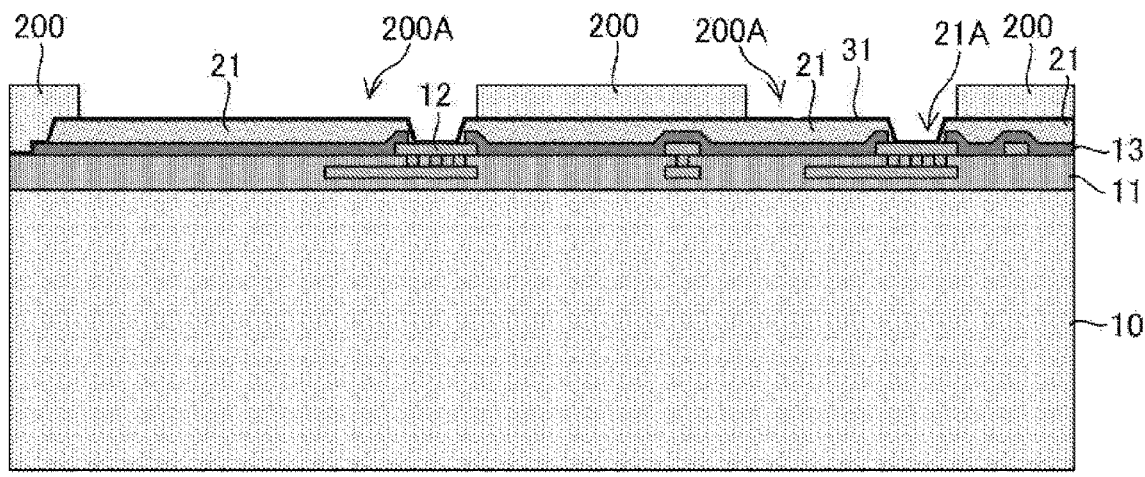
FIG. 5D is a cross-sectional view illustrating one example of the preparation process of the first semiconductor chip of the embodiment of the disclosure.

Next, a known photolithography technology is used to form a resist mask 200 having opening portions 200A corresponding to patterns of the rewire 40 on the surface of the first UBM film 31 (FIG. 5D). The resist mask 200 is formed by coating a photosensitive resist on the first UBM film 31 and performing the exposure and development treatment on the photosensitive resist.

Figure 5E:
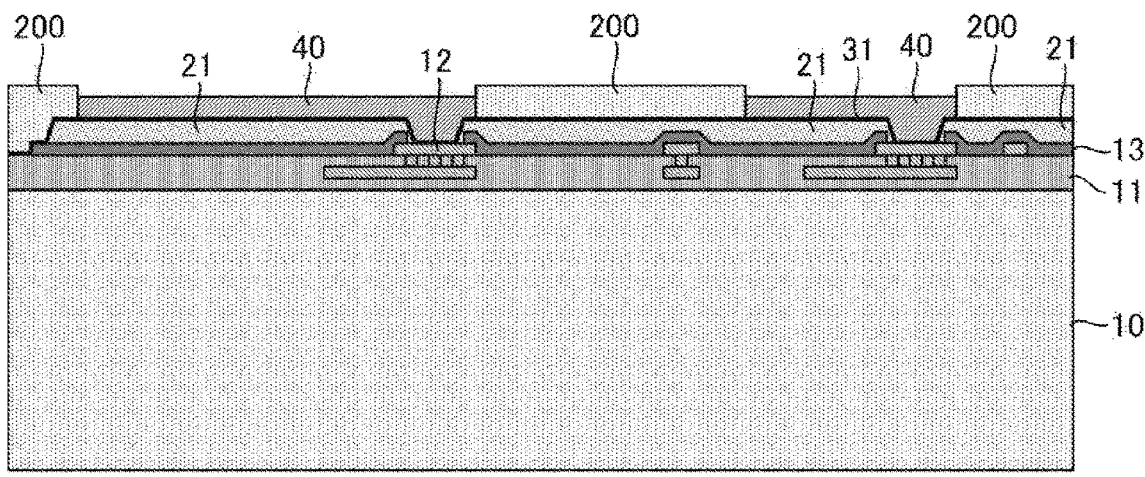
FIG. 5E is a cross-sectional view illustrating one example of the preparation process of the first semiconductor chip of the embodiment of the disclosure.

Next, the electrolytic plating method is used to form the rewire 40 on the surface of the first UBM film 31 (FIG. 5E). Specifically, the surface of the semiconductor substrate 10 is immersed into a plating liquid, and a current is supplied to a plating electrode (not shown) connected to the first UBM film 31. Accordingly, metal is deposited on an exposed portion of the first UBM film 31 (the seed layer), and the rewire 40 is formed on the first UBM film 31. As a material of the rewire 40, for example, Cu can be used. In this case, the seed layer constituting the first UBM film 31 is taken into Cu of the rewire 40. Therefore, a structure in which the Ti film functioning as the adhesion layer is interposed between the rewire 40 and the lower-layer insulation film 21 is obtained.

Figure 5F:
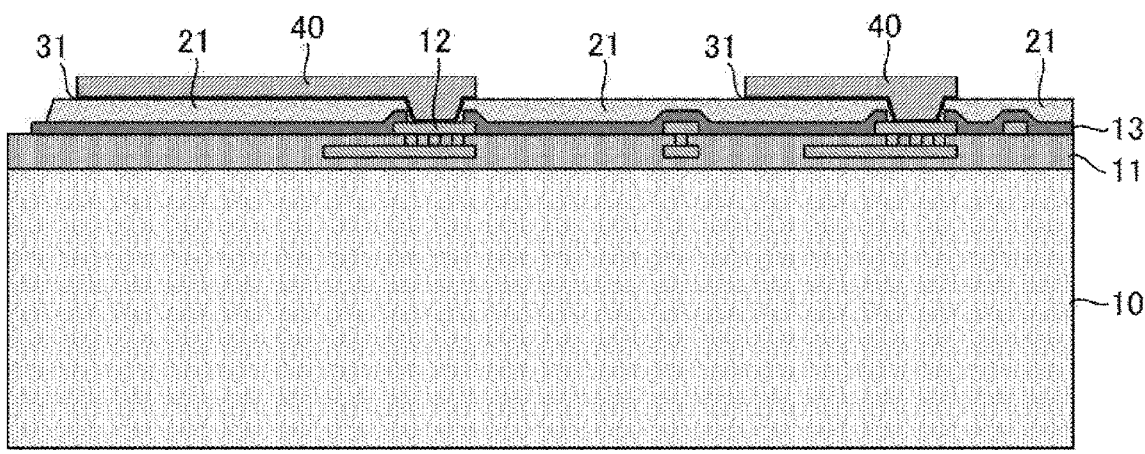
FIG. 5F is a cross-sectional view illustrating one example of the preparation process of the first semiconductor chip of the embodiment of the disclosure.

After the rewire 40 is formed, a known ashing process, organic solvent or the like is used to remove the resist mask 200. After that, the rewire 40 is used as a mask to remove an unnecessary portion of the first UBM film 31 which is covered by the resist mask 200 (FIG. 5F).

Figure 5G:
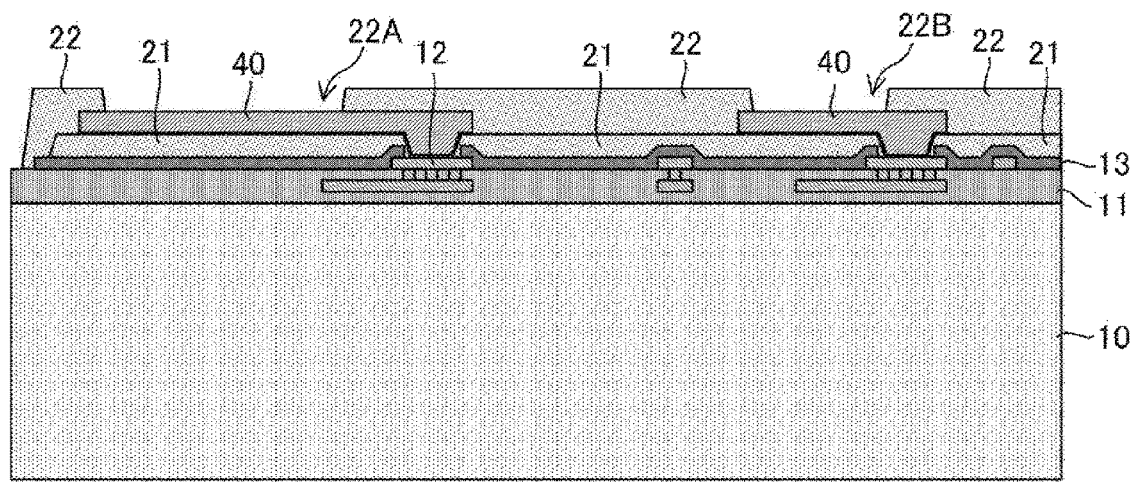
FIG. 5G is a cross-sectional view illustrating one example of the preparation process of the first semiconductor chip of the embodiment of the disclosure.

Next, for example, the spin coating method is used to coat the photosensitive organic insulation member such as polyimide, PBO or the like on the surface of a structure body which is formed by going through the above treatments, and thereby forms the upper-layer insulation film 22 which covers the lower-layer insulation film 21 and the surface of the rewire 40. Subsequently, by performing the exposure and development treatment on the upper-layer insulation film 22, the first opening portions 22A and the second opening portions 22B from which the surface of the rewire 40 is partially exposed are formed on the upper-layer insulation film 22. The first opening portions 22A are formed in an area contained in the area where the columnar electrodes 35 are formed in a plane view. The second opening portions 22B are formed in an area contained in the area where the inter-chip joining electrodes 34 are formed in a plane view. After that, the upper-layer insulation film 22 is cured by the heating treatment (FIG. 5G).

Figure 5H:
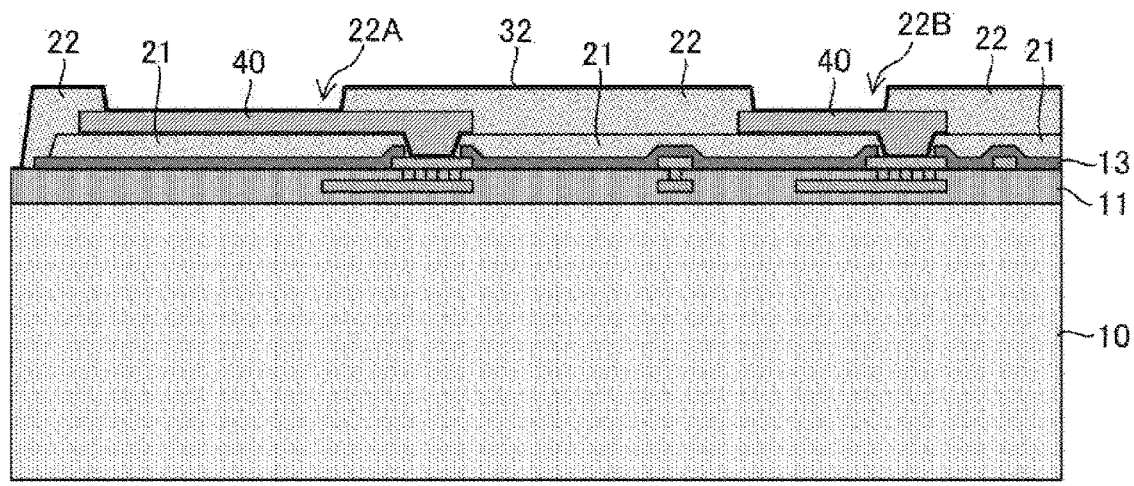
FIG. 5H is a cross-sectional view illustrating one example of the preparation process of the first semiconductor chip of the embodiment of the disclosure.

Next, the second UBM film 32 is formed which covers the surface of the upper-layer insulation film 22 and the surface of the rewire 40 exposed in the first opening portions 22A and the second opening portions 22B (FIG. 5H). The second UBM film 32 is formed, for example, by sequentially forming a Ti film and a Cu film using the sputtering method. The Ti film functions as an adhesion layer for improving adhesion between the upper-layer insulation film 22 and the columnar electrodes 35, the inter-chip joining electrodes 34. The Cu film functions as a seed layer for forming the columnar electrodes 35 and the inter-chip joining electrodes 34 by the electrolytic plating method.

Figure 5I:
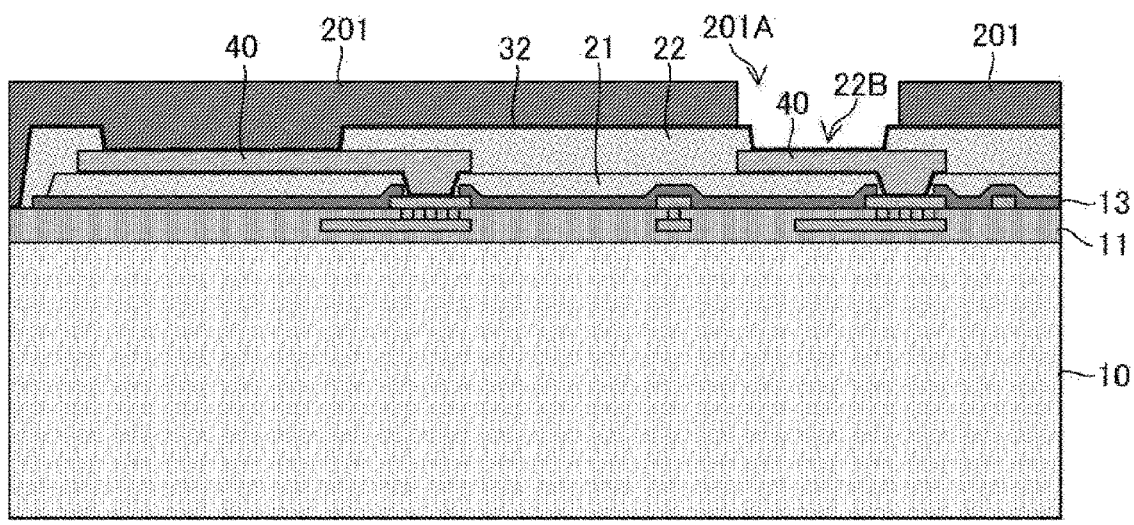
FIG. 5I is a cross-sectional view illustrating one example of the preparation process of the first semiconductor chip of the embodiment of the disclosure.

Next, the known photolithography technology is used to form a resist mask 201 having opening portions 201A at predetermined formation positions of the inter-chip joining electrodes 34 on the surface of the second UBM film 32 (FIG. 5I). The resist mask 201 is formed by coating a photosensitive resist on the second UBM film 32 and performing the exposure and development treatment on the photosensitive resist. The opening portions 201A of the resist mask 201 contain the second opening portions 22B of the upper-layer insulation film 22 and expose the second opening portions 22B.

Figure 5J:
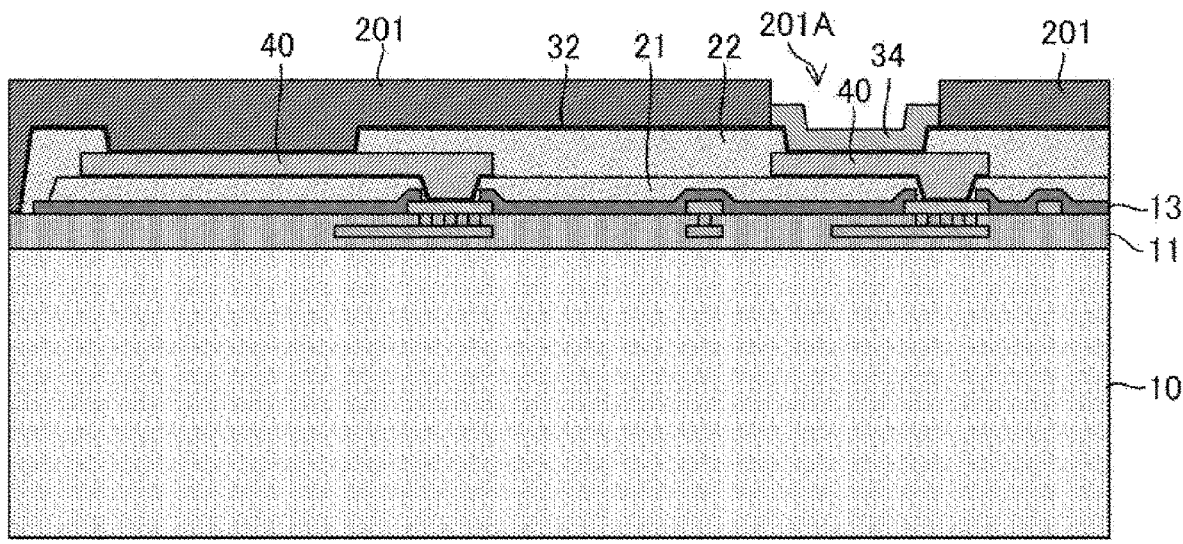
FIG. 5J is a cross-sectional view illustrating one example of the preparation process of the first semiconductor chip of the embodiment of the disclosure.

Next, the electrolytic plating method is used to form the inter-chip joining electrodes 34 on the surface of the second UBM film 32 which is exposed in the opening portions 201A of the resist mask 201 (FIG. 5J). Specifically, the surface of the semiconductor substrate 10 is immersed into the plating liquid, and the current is supplied to a plating electrode (not shown) connected to the second UBM film 32. Accordingly, metal is deposited on an exposed portion of the second UBM film 32 (the seed layer), and the inter-chip joining electrodes 34 are formed on the second UBM film 32. The inter-chip joining electrodes 34 are connected to the rewire 40 via the second UBM film 32. As a material of the inter-chip joining electrodes 34, Ni that does not diffuse into a solder containing SnAg can be used suitably. In this case, a structure in which Ti, Cu and Ni are laminated on portions of the surface of the rewire 40 exposed in the second opening portions 22B is obtained.

Figure 5K:
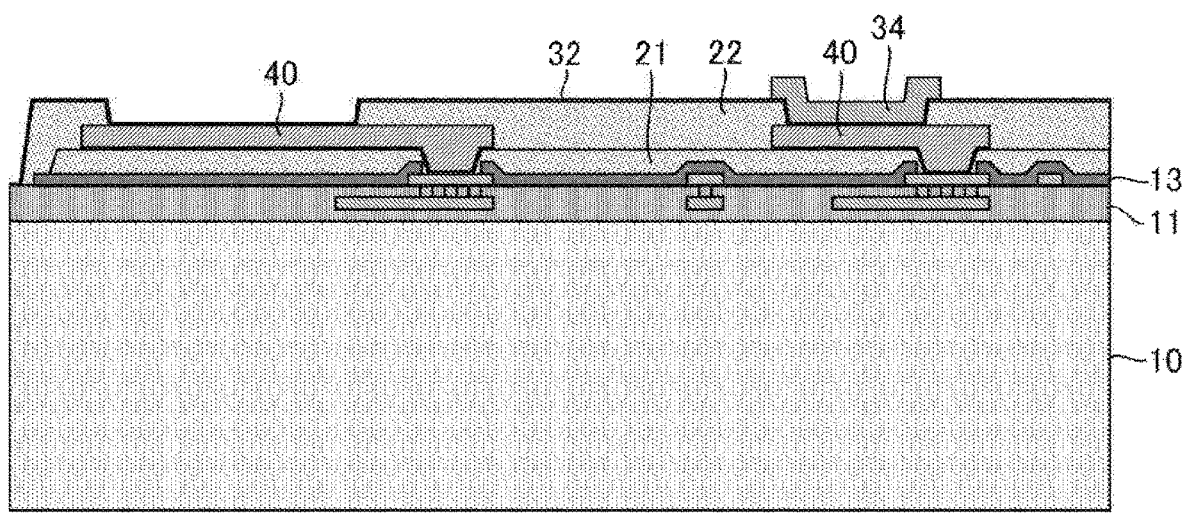
FIG. 5K is a cross-sectional view illustrating one example of the preparation process of the first semiconductor chip of the embodiment of the disclosure.

Next, the known ashing process, organic solvent or the like is used to remove the resist mask 201 (FIG. 5K).

Figure 5L:
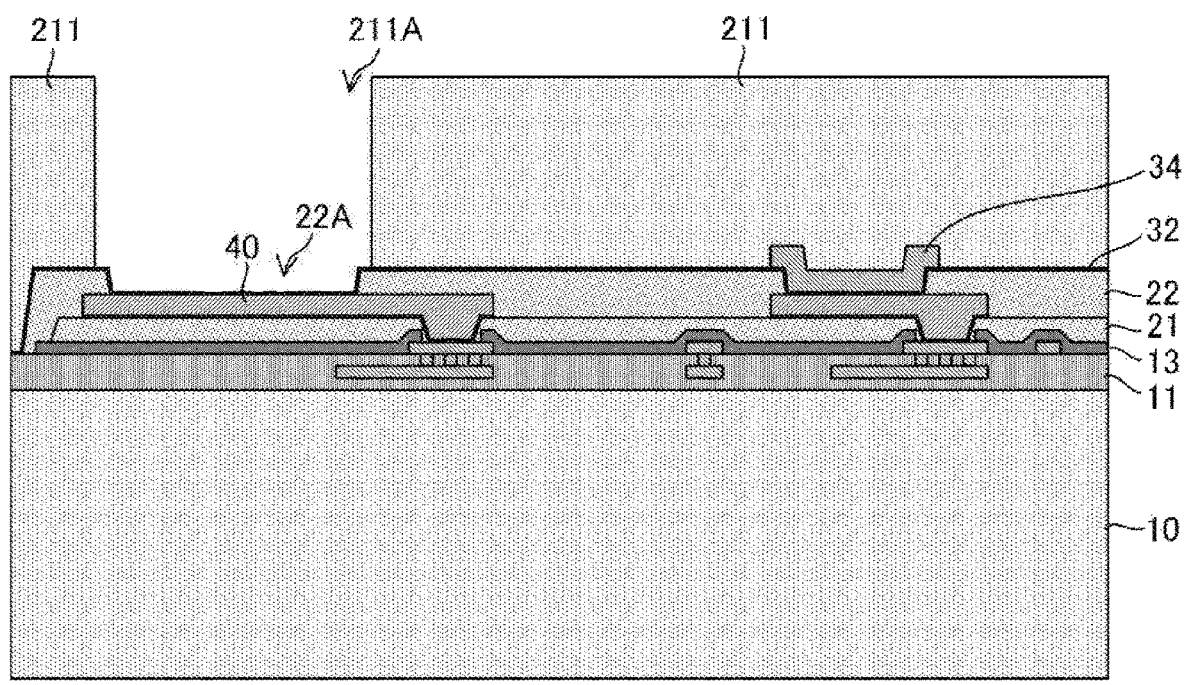
FIG. 5L is a cross-sectional view illustrating one example of the preparation process of the first semiconductor chip of the embodiment of the disclosure.

Next, a first-layer dry film 211 is pasted on the surface of the structure body which is formed by going through the above treatments so that the second UBM film 32 and the surfaces of the inter-chip joining electrodes 34 are covered. The first-layer dry film 211 is a film-like resist member having a photosensitivity and is pasted using a pasting machine for example. After that, by performing the exposure and development treatment on the first-layer dry film 211, opening portions 211A are formed at predetermined formation positions of the columnar electrodes 35. The opening portions 211A of the first-layer dry film 211 contain the first opening portions 22A of the upper-layer insulation film 22 and expose the opening portions 22A (FIG. 5L).

Figure 5M:
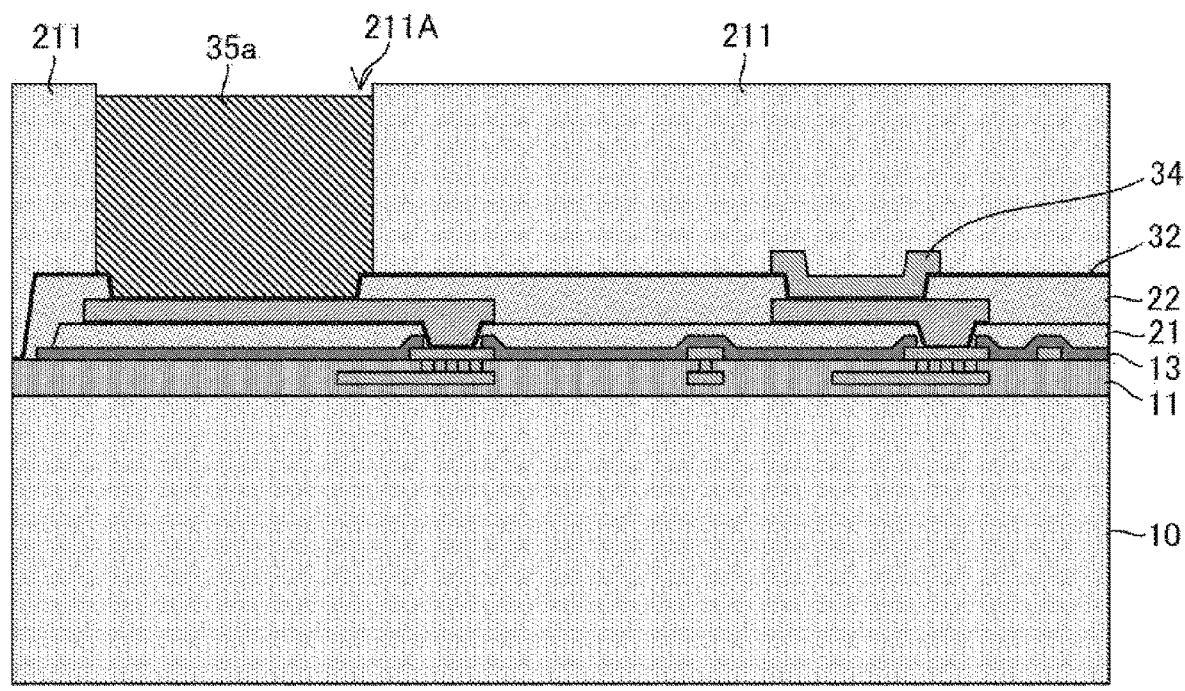
FIG. 5M is a cross-sectional view illustrating one example of the preparation process of the first semiconductor chip of the embodiment of the disclosure.

Next, the electrolytic plating method is used to form the columnar electrodes 35 on the surface of the second UBM film 32 which is exposed in the opening portions 211A of the first-layer dry film 211 (FIG. 5M). Specifically, the surface of the semiconductor substrate 10 is immersed into the plating liquid, and the current is supplied to the plating electrode (not shown) connected to the second UBM film 32. Accordingly, metal is deposited on the exposed portion of the second UBM film 32 (the seed layer), and lower-layer portions 35a of the columnar electrodes 35 are formed on the second UBM film 32. Besides, in an embodiment, the lower-layer portions 35a are formed in a manner that a height position of an upper surface of the lower-layer portions 35a of the columnar electrodes 35 is lower than a height position of an upper surface of the first-layer dry film 211. As a material of the columnar electrodes 35, Cu that is easily processed can be used suitably. In this case, the Cu film which functions as the seed layer constituting the second UBM film 32 is taken into the Cu constituting the columnar electrodes 35. Therefore, a structure in which the Ti film functioning as the adhesion layer is interposed between the columnar electrodes 35 and the rewire 40 is obtained.

Figure 5N:
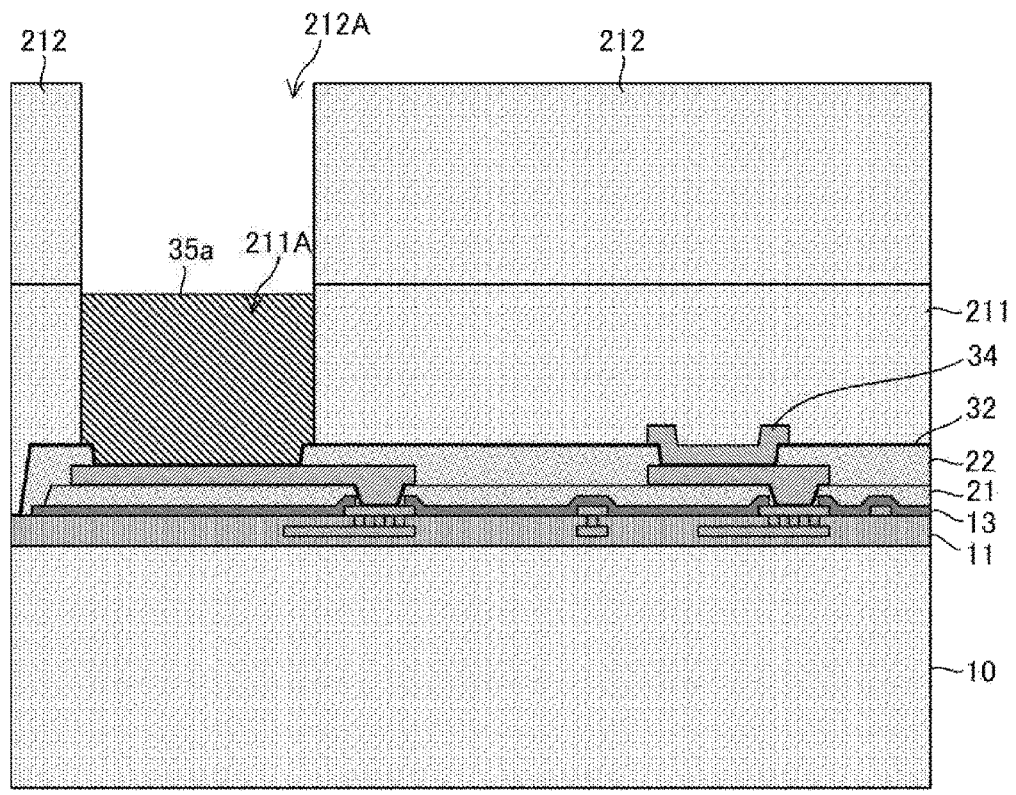
FIG. 5N is a cross-sectional view illustrating one example of the preparation process of the first semiconductor chip of the embodiment of the disclosure.

Next, a second-layer dry film 212 is pasted on the first-layer dry film 211. Similar to the first-layer dry film 211, the second-layer dry film 212 is a film-like resist member having a photosensitivity and is pasted using a pasting machine for example. After that, by performing the exposure and development treatment on the second-layer dry film 212, opening portions 212A are formed at the predetermined formation positions of the columnar electrodes 35. That is, the opening portions 212A of the second-layer dry film 212 communicate with the opening portions 211A of the first-layer dry film 211, and the lower-layer portions 35a of the columnar electrodes 35 are exposed in the opening portions 212A of the second-layer dry film 212 (FIG. 5N).

Figure 5O:
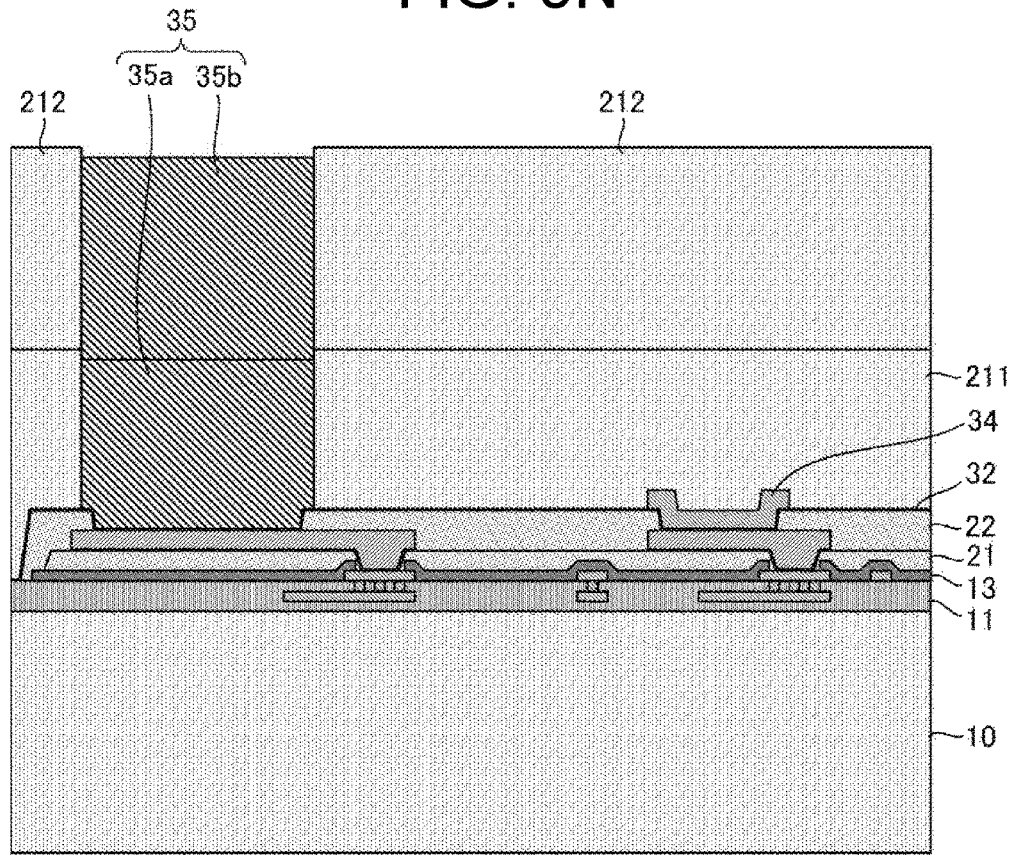
FIG. 5O is a cross-sectional view illustrating one example of the preparation process of the first semiconductor chip of the embodiment of the disclosure.

Next, the electrolytic plating method is used to form upper-layer portions 35b of the columnar electrodes 35 on the surfaces of the lower-layer portions 35a of the columnar electrodes 35 which are exposed in the opening portions 212A of the second-layer dry film 212 (FIG. 5O). Specifically, the surface of the semiconductor substrate 10 is immersed into the plating liquid, and the current is supplied to the plating electrode (not shown) connected to the second UBM film 32. Accordingly, metal is deposited on the surfaces of the lower-layer portions 35a of the columnar electrodes 35, and the upper-layer portions 35b of the columnar electrodes 35 are formed on the surfaces of the lower-layer portions 35a of the columnar electrodes 35. Besides, in an embodiment, the upper-layer portions 35b are formed in a manner that a height position of an upper surface of the upper-layer portions 35b of the columnar electrodes 35 is higher than a height position of an upper surface of the second-layer dry film 212.

Figure 5P:
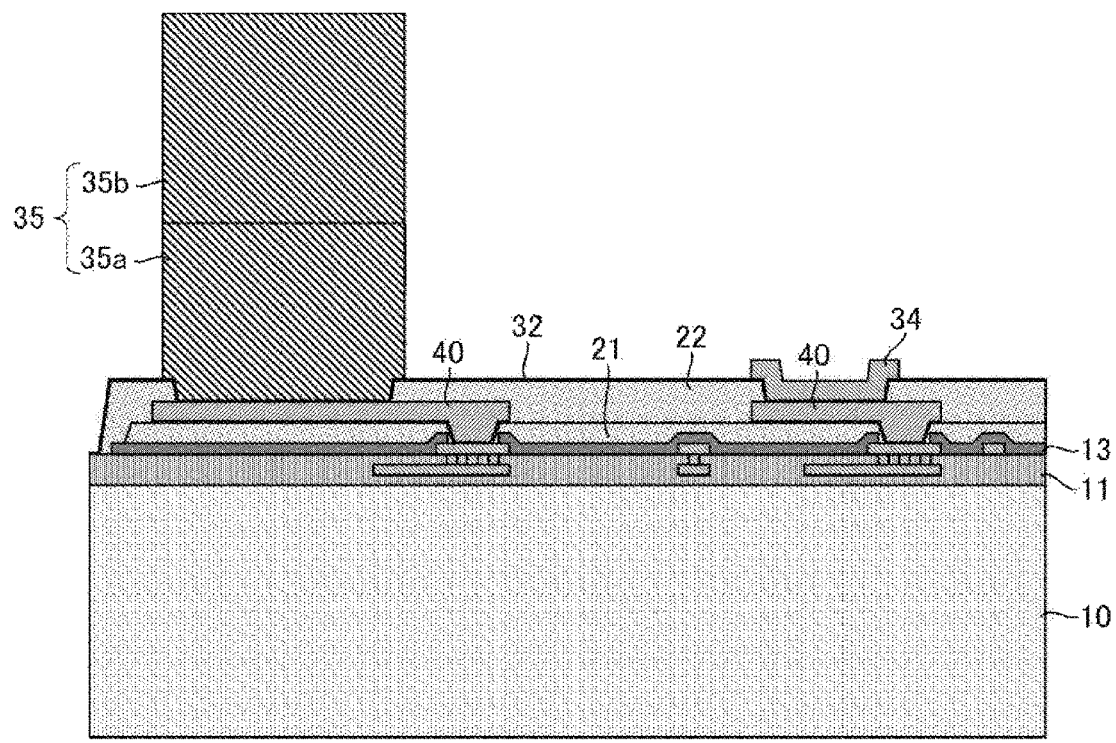
FIG. 5P is a cross-sectional view illustrating one example of the preparation process of the first semiconductor chip of the embodiment of the disclosure.

After the columnar electrodes 35 are formed, an organic stripping liquid or the like is used to remove the first-layer dry film 211 and the second-layer dry film 212 (FIG. 5P).

Figure 5Q:
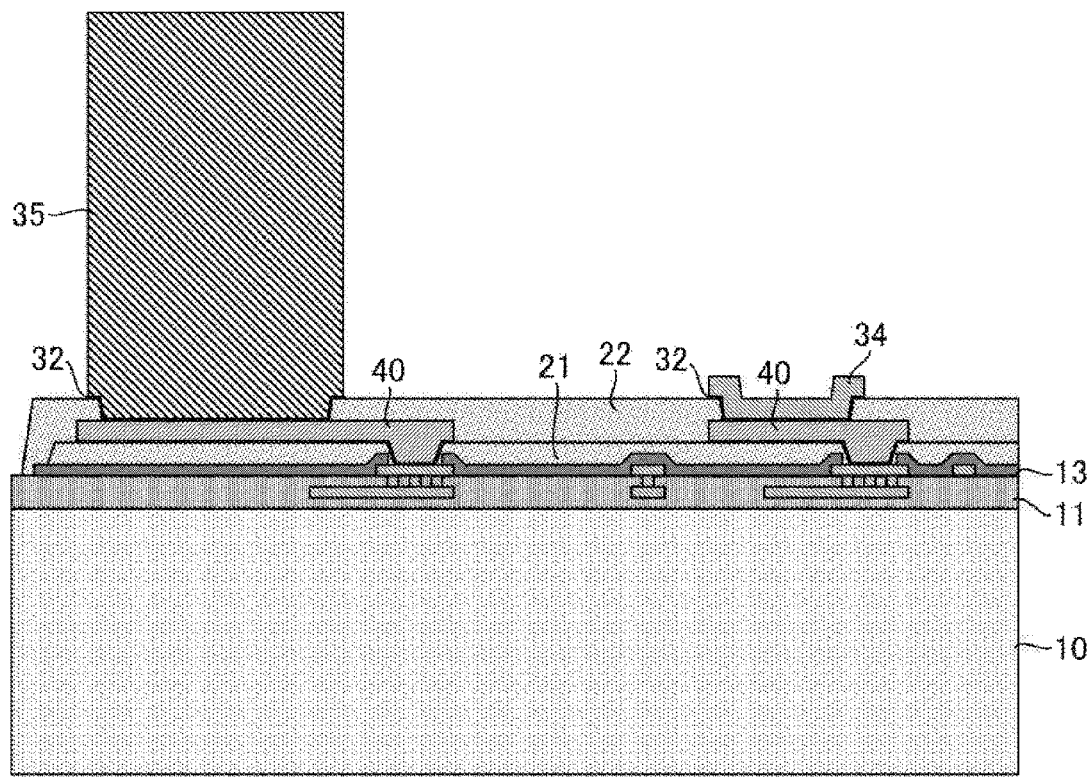
FIG. 5Q is a cross-sectional view illustrating one example of the preparation process of the first semiconductor chip of the embodiment of the disclosure.

Next, the columnar electrodes 35 and the inter-chip joining electrodes 34 are used as a mask to remove an unnecessary portion of the second UBM film 32 which is covered by the first-layer dry film 211 (FIG. 5Q). Accordingly, the plating electrode (not shown) which is used in the plating treatment for forming the inter-chip joining electrodes 34 and the columnar electrodes 35 is also removed.

Next, the preparation process of the second semiconductor chip 102 is described with reference to FIG. 6A-FIG. 6Q.

Figure 6A:
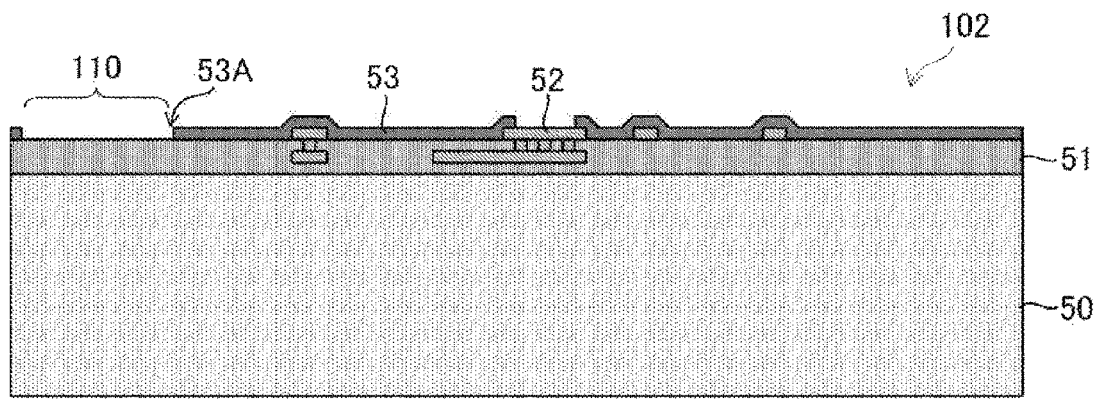
FIG. 6A is a cross-sectional view illustrating one example of a preparation process of the second semiconductor chip of the embodiment of the disclosure.

A semiconductor wafer for which a wafer process of the second semiconductor chip 102 is completed is prepared (FIG. 6A). The wafer process of the second semiconductor chip 102 includes a process for forming circuit elements (not shown) such as a transistor on the semiconductor substrate 50, a process for forming the interlayer insulation film 51 which is configured by an insulator of $SiO_2$ and the like on the surface of the semiconductor substrate 50, a process for forming the chip electrodes 52 on the surface of the interlayer insulation film 51, and a process for forming the passivation film 53 so that the chip electrodes 52 are partially exposed on the surface of the interlayer insulation film 51. The semiconductor wafer having the second semiconductor chip 102 includes an element formation area in which the circuit elements are formed, and a scribe line 110 which divides the element formation area. The interlayer insulation film 51 covers the entire surface of the semiconductor substrate 50, and the passivation film 53 covers the element formation area. The passivation film 53 includes opening portions 53A from which the scribe line 110 is exposed.

Figure 6B:
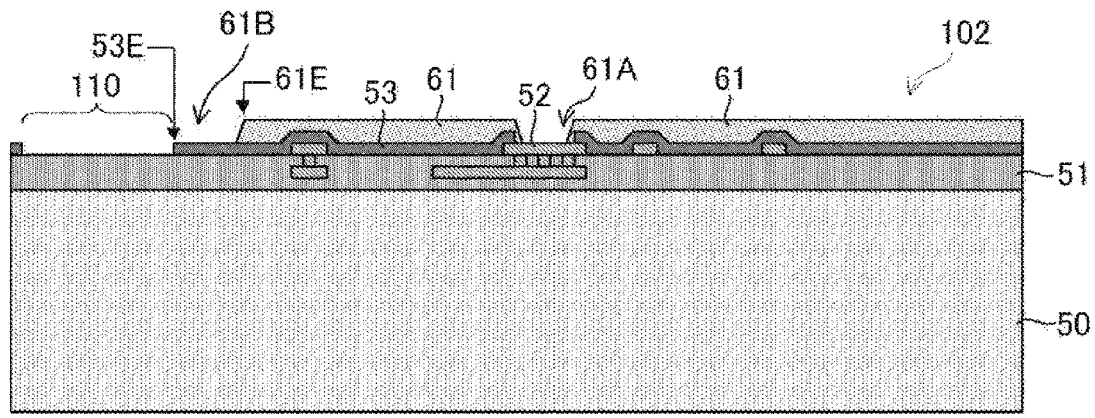
FIG. 6B is a cross-sectional view illustrating one example of the preparation process of the second semiconductor chip of the embodiment of the disclosure.

Next, for example, the spin coating method is used to coat the photosensitive organic insulation member such as polyimide, PBO or the like on the surface of the second semiconductor chip 102, and thereby forms the lower-layer insulation film 61 which covers the surfaces of the passivation film 53, the chip electrodes 52 and the scribe line 110. Subsequently, by performing the exposure and development treatment on the lower-layer insulation film 61, opening portions 61A from which the surfaces of the chip electrodes 52 are partially exposed and opening portions 61B from which the scribe line 110 is exposed are formed on the lower-layer insulation film 61. The end portion 61E of the lower-layer insulation film 61 is disposed closer to the inner peripheral side of the second semiconductor chip 102 than the end portion 53E of the passivation film 53. After that, the lower-layer insulation film 61 is cured by the heat treatment (FIG. 6B).

Figure 6C:
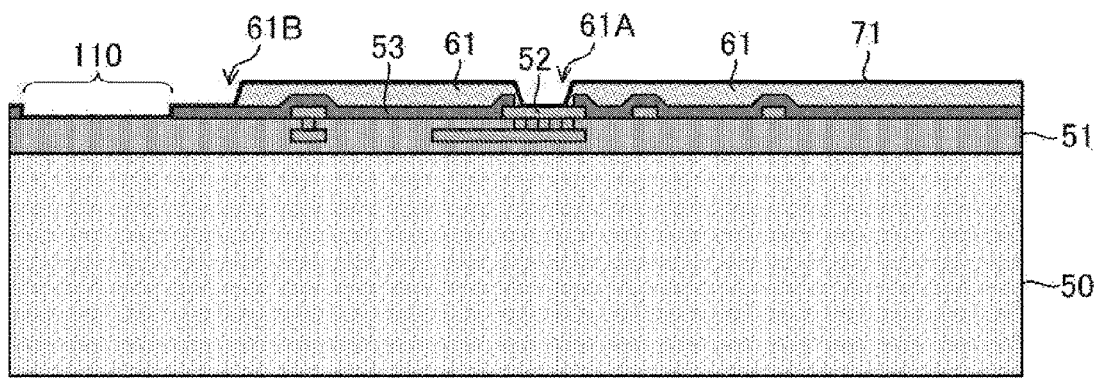
FIG. 6C is a cross-sectional view illustrating one example of the preparation process of the second semiconductor chip of the embodiment of the disclosure.

Next, a third UBM film 71 is formed which covers the surface of the lower-layer insulation film 61 and the surfaces of the chip electrodes 52 which are exposed in the opening portions 61A (FIG. 6C). The third UBM film 71 is formed, for example, by sequentially forming a Ti film and a Cu film using the sputtering method. The Ti film functions as an adhesion layer for improving adhesion between the lower-layer insulation film 61 and the rewire 80. The Cu film functions as a seed layer for forming the rewire 80 by the electrolytic plating method.

Figure 6D:
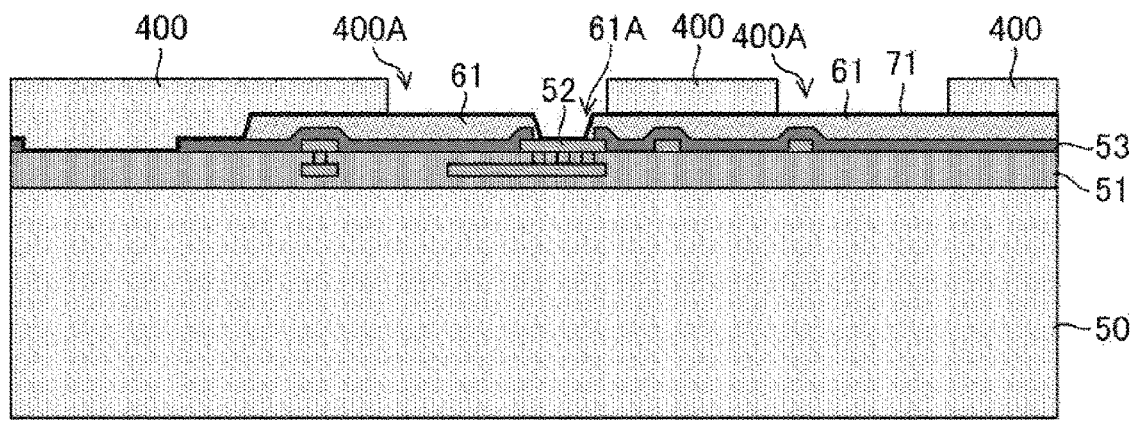
FIG. 6D is a cross-sectional view illustrating one example of the preparation process of the second semiconductor chip of the embodiment of the disclosure.

Next, the known photolithography technology is used to form a resist mask 400 having opening portions 400A corresponding to patterns of the rewire 80 on the surface of the third UBM film 71 (FIG. 6D). The resist mask 400 is formed by coating a photosensitive resist on the third UBM film 71 and performing the exposure and development treatment on the photosensitive resist.

Figure 6E:
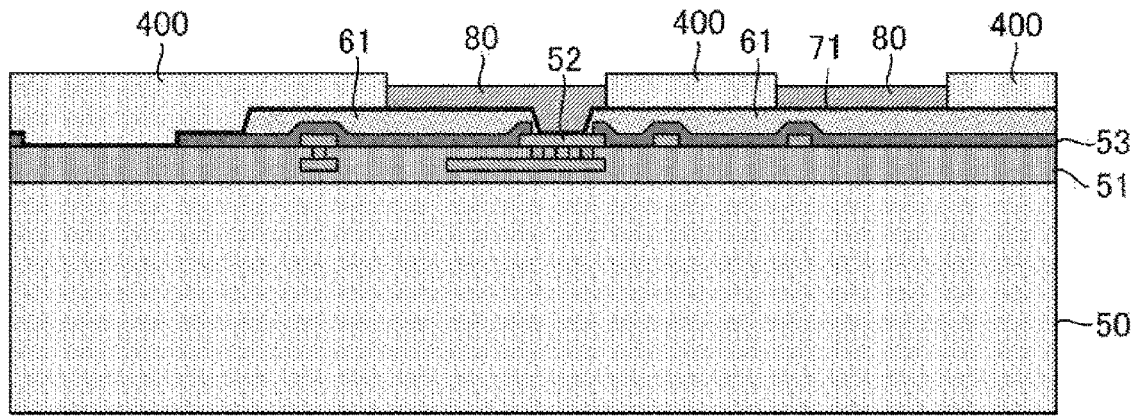
FIG. 6E is a cross-sectional view illustrating one example of the preparation process of the second semiconductor chip of the embodiment of the disclosure.

Next, the electrolytic plating method is used to form the rewire 80 on the surface of the third UBM film 71 (FIG. 6E). Specifically, the surface of the semiconductor substrate 50 is immersed into a plating liquid, and a current is supplied to a plating electrode (not shown) connected to the third UBM film 71. Accordingly, metal is deposited on an exposed portion of the third UBM film 71 (the seed layer), and the rewire 80 is formed on the third UBM film 71. As a material of the rewire 80, for example, Cu can be used. In this case, the seed layer constituting the third UBM film 71 is taken into the Cu of the rewire 80. Therefore, a structure in which the Ti film functioning as the adhesion layer is interposed between the rewire 80 and the lower-layer insulation film 61 is obtained.

Figure 6F:
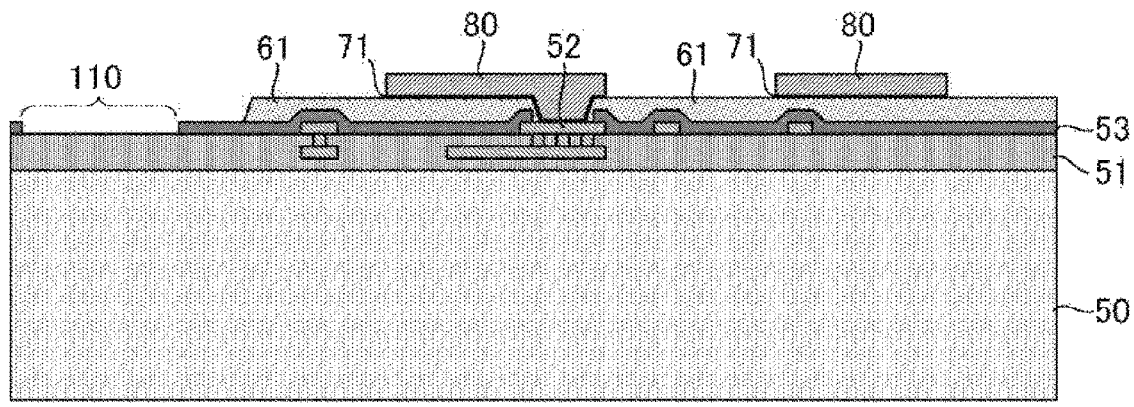
FIG. 6F is a cross-sectional view illustrating one example of the preparation process of the second semiconductor chip of the embodiment of the disclosure.

After the rewire 80 is formed, the known ashing process, organic solvent or the like is used to remove the resist mask 400. After that, the rewire 80 is used as a mask to remove an unnecessary portion of the third UBM film 71 which is covered by the resist mask 400 (FIG. 6F).

Figure 6G:
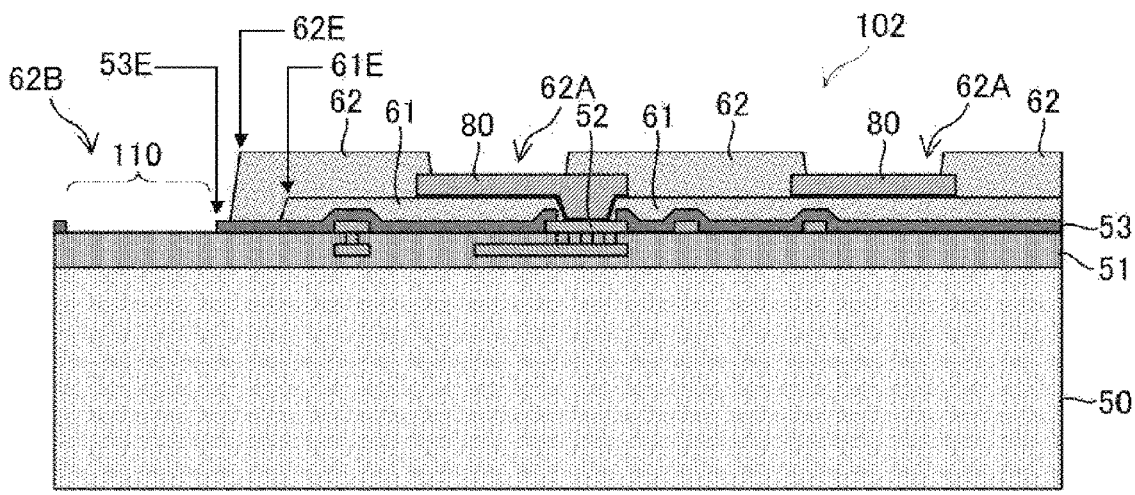
FIG. 6G is a cross-sectional view illustrating one example of the preparation process of the second semiconductor chip of the embodiment of the disclosure.

Next, for example, the spin coating method is used to coat the photosensitive organic insulation member such as polyimide, PBO or the like on the surface of the structure body which is formed by going through the above treatments, and thereby forms the upper-layer insulation film 62 which covers the lower-layer insulation film 61, the rewire 80 and the scribe line 110. Subsequently, by performing the exposure and development treatment on the upper-layer insulation film 62, opening portions 62A from which the surface of the rewire 80 is partially exposed and opening portions 62B from which the scribe line 110 is exposed are formed on the upper-layer insulation film 62. The opening portions 62A are formed in an area contained in the area where the inter-chip joining electrodes 74 are formed in a plane view. The end portion 62E of the upper-layer insulation film 62 is disposed closer to the inner peripheral side of the second semiconductor chip 102 than the end portion 53E of the passivation film 53, and is disposed closer to the outer periphery side of the second semiconductor chip 102 than the end portion 61E of the lower-layer insulation film 61. After that, the upper-layer insulation film 62 is cured by the heat treatment (FIG. 6G).

Figure 6H:
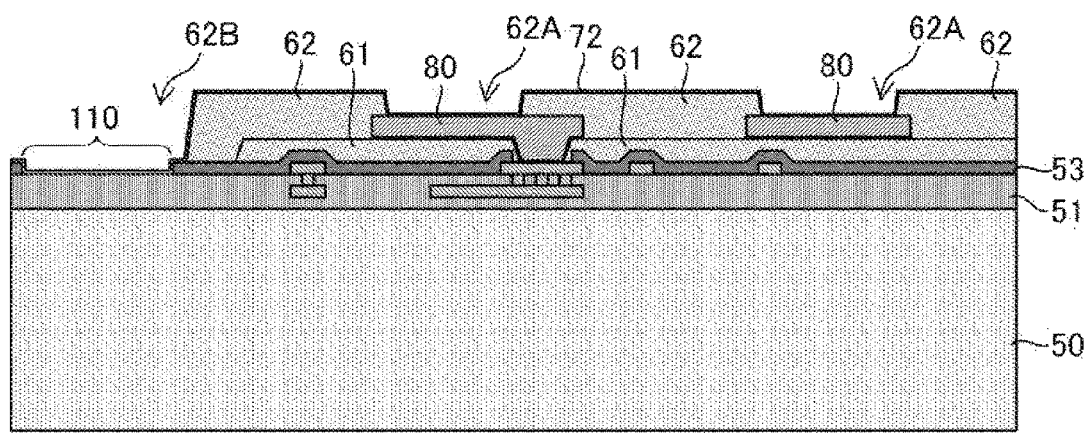
FIG. 6H is a cross-sectional view illustrating one example of the preparation process of the second semiconductor chip of the embodiment of the disclosure.

Next, a fourth UBM film 72 is formed which covers the surface of the upper-layer insulation film 62 and the surface of the rewire 80 exposed in the opening portions 62A (FIG. 6H). The fourth UBM film 72 is formed, for example, by sequentially forming a Ti film and a Cu film using the sputtering method. The Ti film functions as an adhesion layer for improving adhesion between the upper-layer insulation film 62 and the inter-chip joining electrodes 74. The Cu film functions as a seed layer for forming the inter-chip joining electrodes 74 by the electrolytic plating method.

Figure 6I:
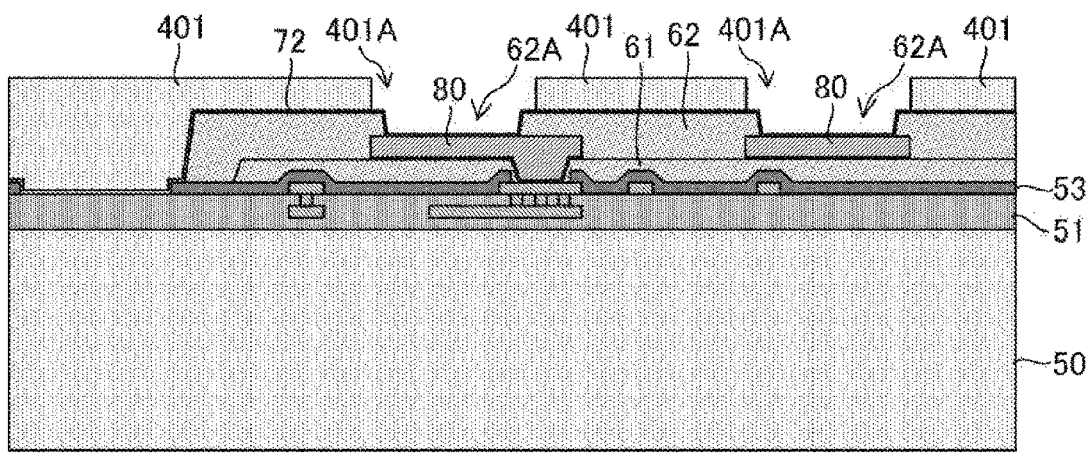
FIG. 6I is a cross-sectional view illustrating one example of the preparation process of the second semiconductor chip of the embodiment of the disclosure.

Next, the known photolithography technology is used to form a resist mask 401 having opening portions 401A at predetermined formation positions of the inter-chip joining electrodes 74 on the surface of the fourth UBM film 72 (FIG. 6I). The resist mask 401 is formed by coating a photosensitive resist on the fourth UBM film 72 and performing the exposure and development treatment on the photosensitive resist. The opening portions 401A of the resist mask 401 contain the opening portions 62A of the upper-layer insulation film 62 and expose the opening portions 62A.

Figure 6J:
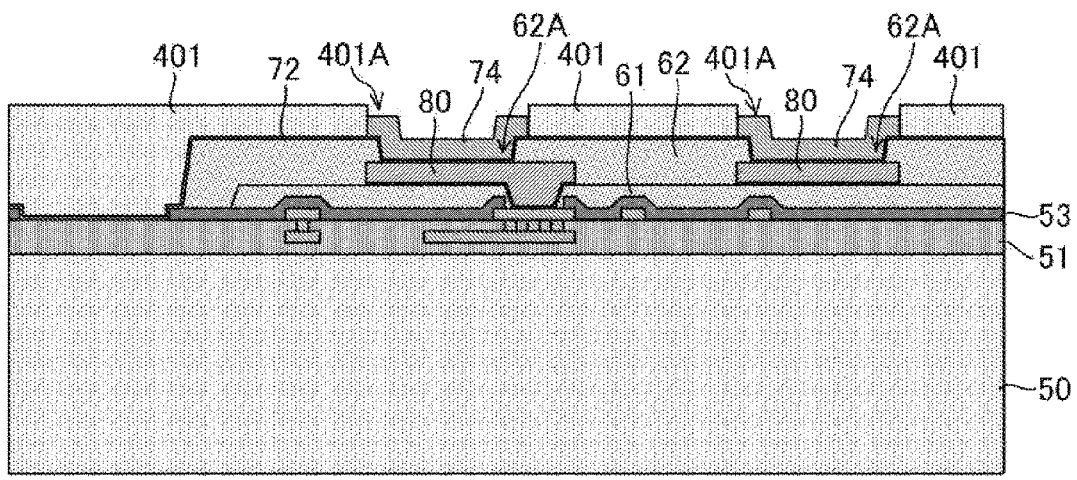
FIG. 6J is a cross-sectional view illustrating one example of the preparation process of the second semiconductor chip of the embodiment of the disclosure.

Next, the electrolytic plating method is used to form the inter-chip joining electrodes 74 on the surface of the fourth UBM film 72 which is exposed in the opening portions 401A of the resist mask 401 (FIG. 6J). Specifically, the surface of the semiconductor substrate 50 is immersed into the plating liquid, and the current is supplied to a plating electrode (not shown) connected to the fourth UBM film 72. Accordingly, metal is deposited on an exposed portion of the fourth UBM film 72 (the seed layer), and the inter-chip joining electrodes 74 are formed on the fourth UBM film 72. The inter-chip joining electrodes 74 are connected to the rewire 80 via the fourth UBM film 72. As a material of the inter-chip joining electrodes 74, Ni that does not diffuse into a solder containing SnAg can be used suitably. In this case, a structure in which Ti, Cu and Ni are laminated on portions of the surface of the rewire 80 exposed in the opening portions 62A is obtained.

Figure 6K:
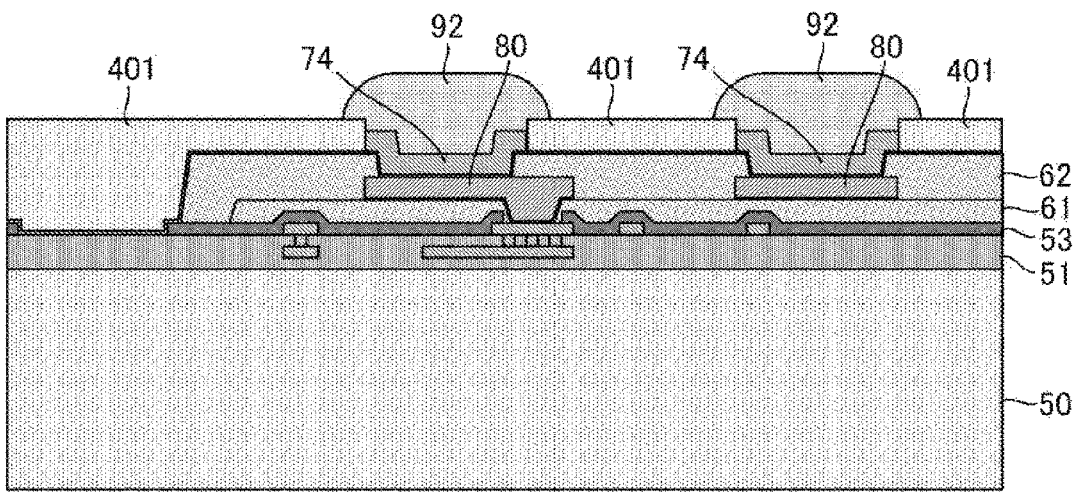
FIG. 6K is a cross-sectional view illustrating one example of the preparation process of the second semiconductor chip of the embodiment of the disclosure.

Next, the electrolytic plating method is used to form the joining member 92 which is configured by the SnAg solder on the inter-chip joining electrodes 74 (FIG. 6K). Specifically, the surface of the semiconductor substrate 50 is immersed into the plating liquid while leaving the resist mask 401 thereon and the current is supplied to the plating electrode (not shown) connected to the fourth UBM film 72. Accordingly, metal is deposited on the surface of the inter-chip joining electrodes 74, and the joining member 92 is formed on the inter-chip joining electrodes 74.

Figure 6L:
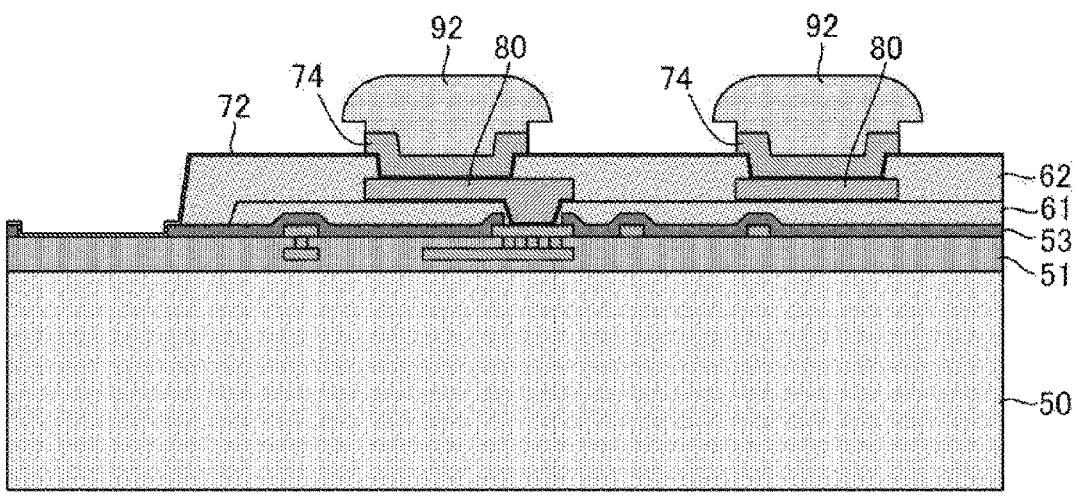
FIG. 6L is a cross-sectional view illustrating one example of the preparation process of the second semiconductor chip of the embodiment of the disclosure.
Figure 6M:
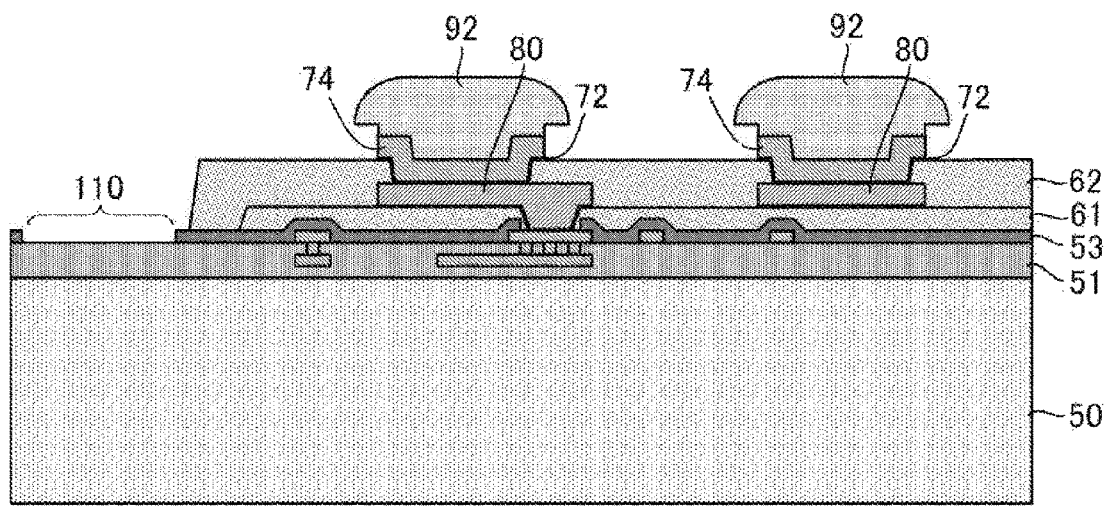
FIG. 6M is a cross-sectional view illustrating one example of the preparation process of the second semiconductor chip of the embodiment of the disclosure.

Next, the known ashing process, organic solvent or the like is used to remove the resist mask 401 (FIG. 6L). Next, the inter-chip joining electrodes 74 are used as a mask to remove an unnecessary of the fourth UBM film 72 which covers the surface of the upper-layer insulation film 62 and the surface of the scribe line 110 (FIG. 6M).

Figure 6N:
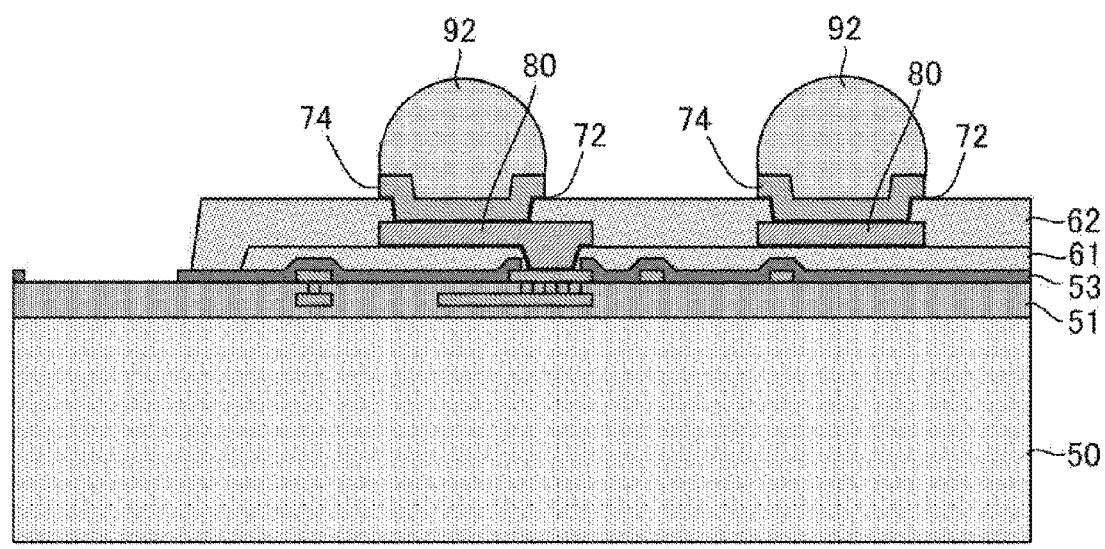
FIG. 6N is a cross-sectional view illustrating one example of the preparation process of the second semiconductor chip of the embodiment of the disclosure.
Figure 6O:
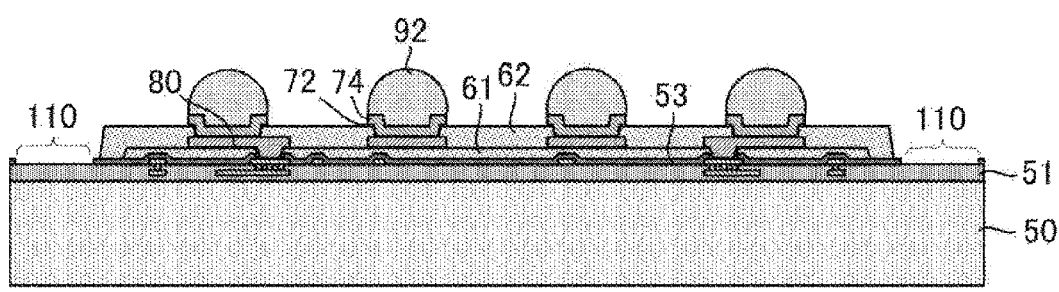
FIG. 6O is a cross-sectional view illustrating one example of the preparation process of the second semiconductor chip of the embodiment of the disclosure.

Next, after flux is coated on the electrode formation surface S21 of the second semiconductor chip 102, a reflow treatment is performed on the second semiconductor chip 102 and thereby the shape of the joining member 92 is set into a ball shape (FIG. 6N, FIG. 6O).

Figure 6P:
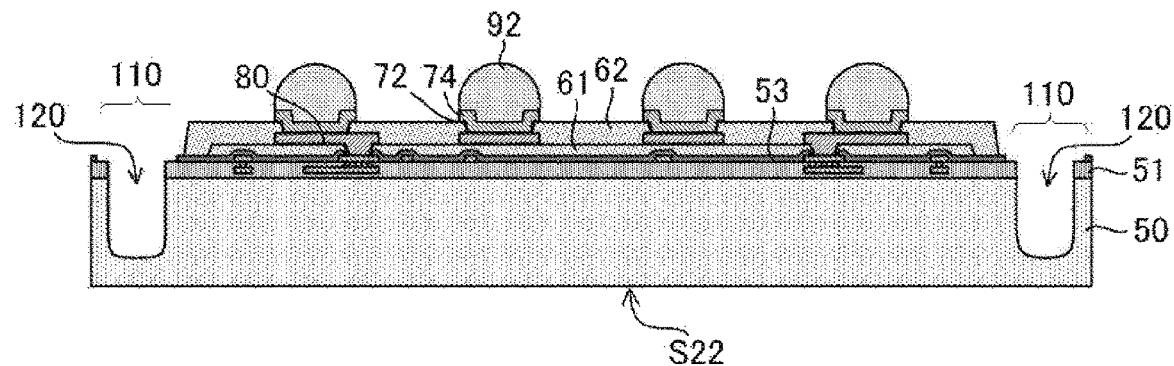
FIG. 6P is a cross-sectional view illustrating one example of the preparation process of the second semiconductor chip of the embodiment of the disclosure.
Figure 6Q:
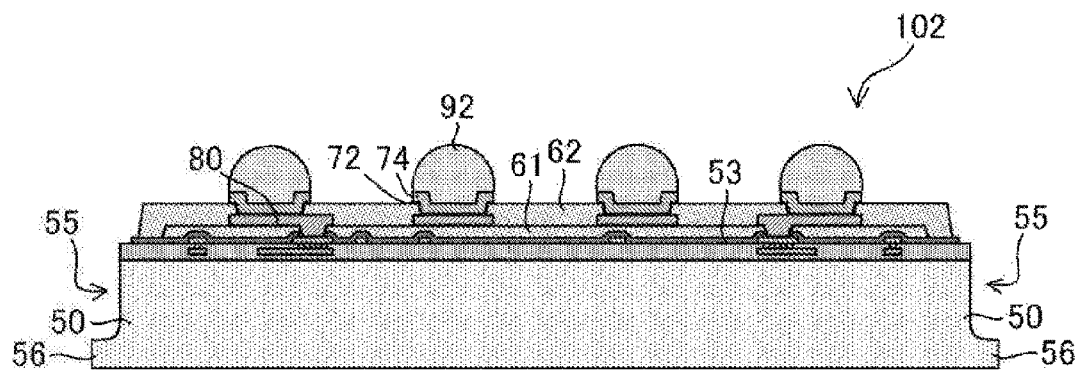
FIG. 6Q is a cross-sectional view illustrating one example of the preparation process of the second semiconductor chip of the embodiment of the disclosure.

Next, a groove 120 is formed on the semiconductor substrate 50 along the scribe line 110 of the semiconductor wafer including the semiconductor substrate 50 (FIG. 6P). The groove 120 is formed at a depth that does not penetrate the semiconductor substrate 50. For example, the groove 120 can be formed by scanning a dicing blade (not shown) having a width corresponding to the width of the groove 120 along the scribe line 110. Besides, before or after the groove 120 is formed, the back surface S22 of the semiconductor substrate 50 may be polished so that the thickness of the semiconductor substrate 50 becomes a desired thickness. When the back surface S22 of the semiconductor substrate 50 is ground after the groove 120 is formed, the grinding is performed in a manner that the back surface S22 of the semiconductor substrate 50 retreating due to the grinding does not reach the bottom of the groove 120.

Next, a dicing blade (not shown) having a width smaller than the width of the dicing blade used in the formation of the groove 120 is inserted into the inside of the groove 120 to cut the semiconductor wafer including the semiconductor substrate 50 along the scribe line 110. Accordingly, the concave portion 55 and the projection portion 56 are formed on the side surface of the semiconductor substrate 50, and the second semiconductor chip 102 is individualized (FIG. 6Q).

Next, the packaging process is described with reference to FIG. 7A-FIG. 7E.

Figure 7A:
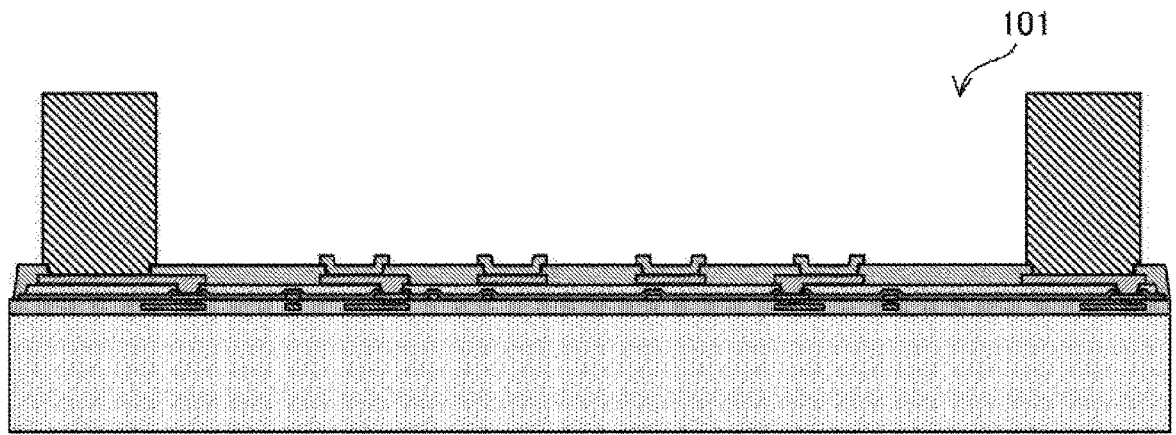
FIG. 7A is a cross-sectional view illustrating one example of a packaging process of the embodiment of the disclosure.
Figure 7B:
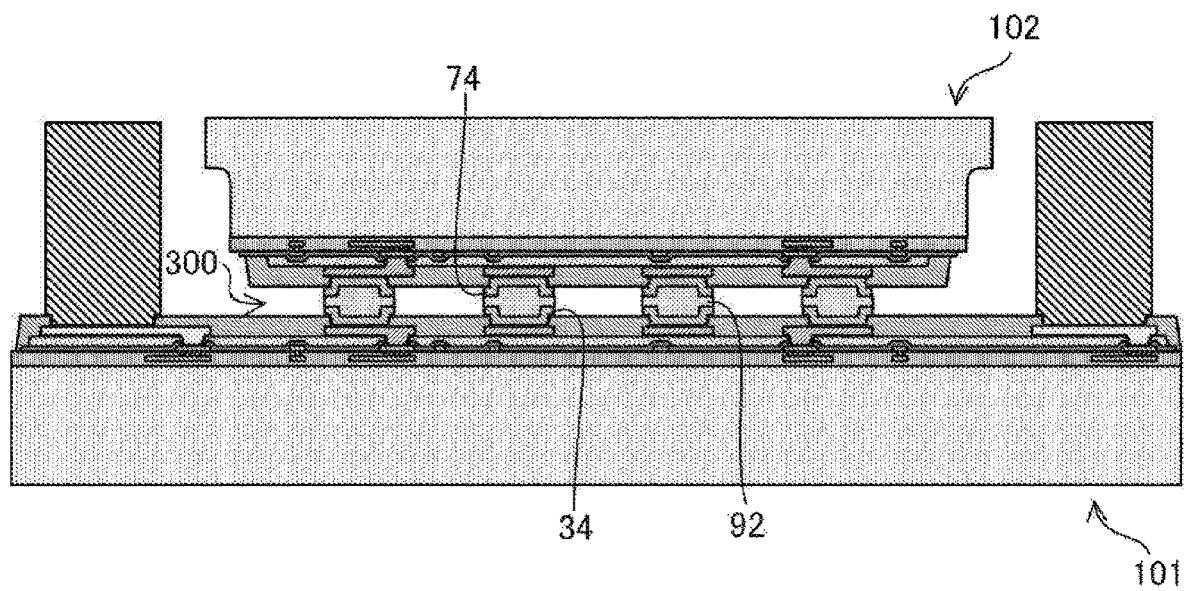
FIG. 7B is a cross-sectional view illustrating one example of the packaging process of the embodiment of the disclosure.

Firstly, the first semiconductor chip 101 is prepared (FIG. 7A). Next, the first semiconductor chip 101 and the second semiconductor chip 102 are joined (FIG. 7B). Specifically, the reflow treatment is performed in a state that the joining member 92 formed on the inter-chip joining electrodes 74 of the second semiconductor chip 102 is brought into contact with the inter-chip joining electrodes 34 of the first semiconductor chip 101. Accordingly, the respective inter-chip joining electrodes 34 of the first semiconductor chip 101 and the inter-chip joining electrodes 74 of the second semiconductor chip 102 are electrically and mechanically joined via the joining member 92. Between the first semiconductor chip 101 and the second semiconductor chip 102, the gap 300 corresponding to the thicknesses of the inter-chip joining electrodes 34, 74 and the joining member 92 is formed.

Figure 7C:
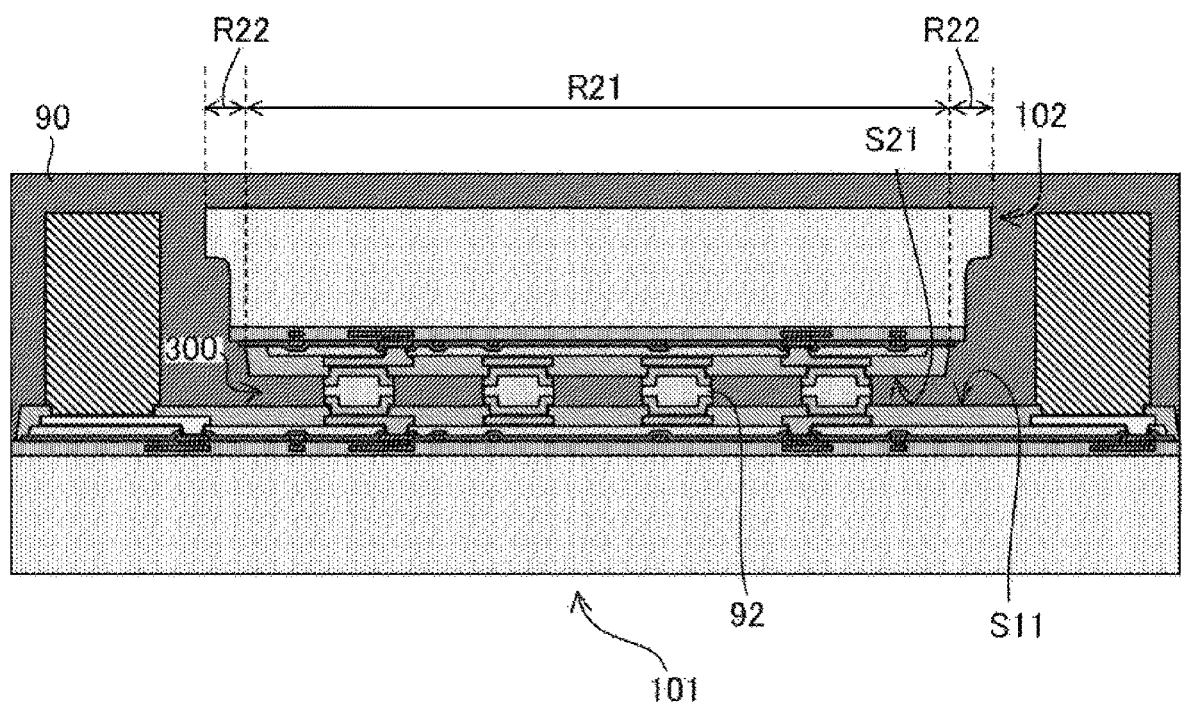
FIG. 7C is a cross-sectional view illustrating one example of the packaging process of the embodiment of the disclosure.

Next, on the electrode formation surface S11 side of the first semiconductor chip 101, the sealing resin 90 is formed so that the second semiconductor chip 102 and the columnar electrodes 35 are embedded inside (FIG. 7C). The sealing resin 90 can be formed by compression molding or screen printing for example. The sealing resin 90 is respectively filled between the first semiconductor chip 101 and the inner peripheral area R21 of the second semiconductor chip 102 (that is, in the gap 300), and between the first semiconductor chip 101 and the outer peripheral area R22 of the second semiconductor chip 102. In addition, the sealing resin 90 is filled between the columnar electrodes 35 and the second semiconductor chip 102. The side surface of the joining member 92 is covered by the sealing resin 90 which is filled into the gap 300 formed between the first semiconductor chip 101 and the second semiconductor chip 102. Besides, a portion of the sealing resin 90 filled into the gap 300 and a portion of the sealing resin 90 filled between the second semiconductor chip 102 and the columnar electrodes 35 include fillers having the same size.

Figure 7D:
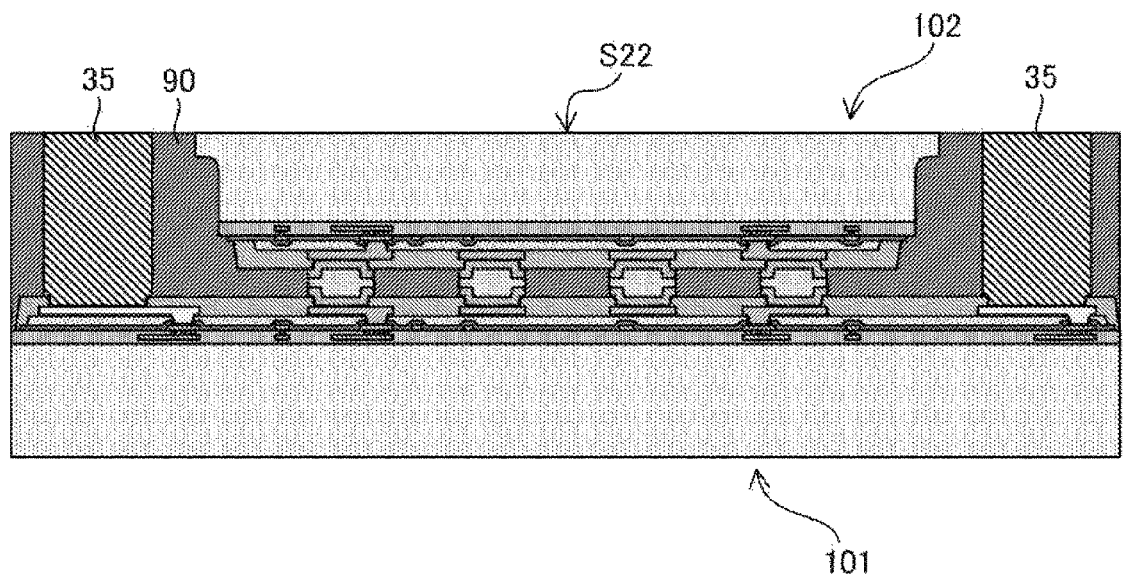
FIG. 7D is a cross-sectional view illustrating one example of the packaging process of the embodiment of the disclosure.

Next, a portion of the sealing resin 90, which covers the top of the columnar electrodes 35 and the back surface S22 of the second semiconductor chip 102, is removed by grinding, and thereby the top of the columnar electrodes 35 and the back surface S22 of the second semiconductor chip 102 are exposed (FIG. 7D). A grinder can be used in the grinding of the sealing resin 90. Besides, in a case of a package form in which the back surface S22 of the second semiconductor chip 102 is covered by the sealing resin 90, the height position of the top of the columnar electrodes 35 is disposed higher than the height position of the back surface S22 of the second semiconductor chip 102, and only the top of the columnar electrodes 35 is exposed by the grinding of the sealing resin 90.

Figure 7E:
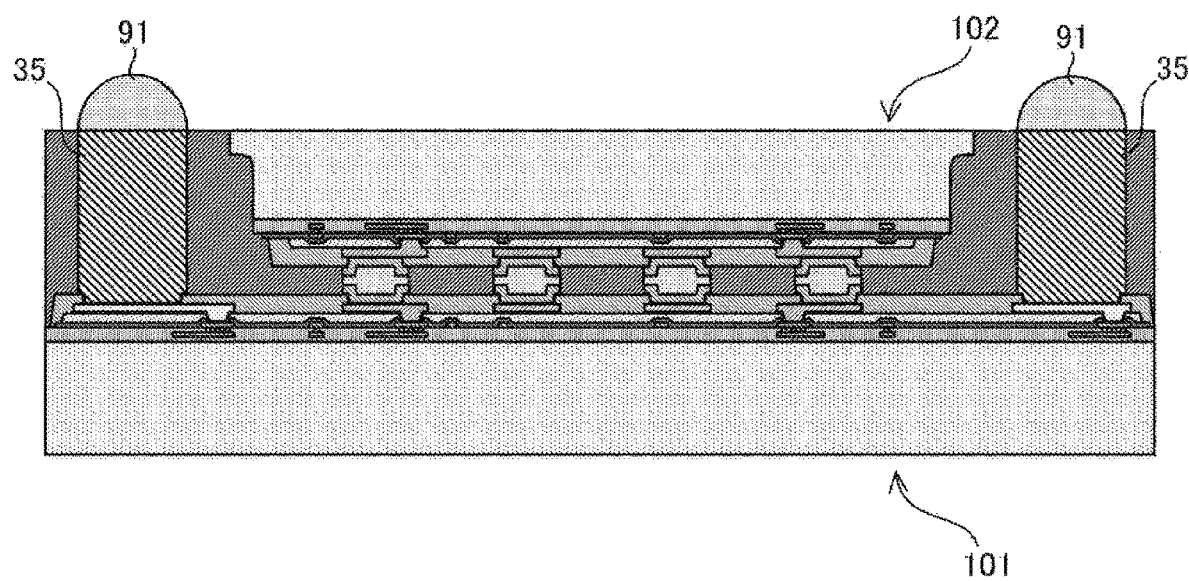
FIG. 7E is a cross-sectional view illustrating one example of the packaging process of the embodiment of the disclosure.

Next, the external connection terminals 91 are formed at the top of the columnar electrodes 35 exposed from the sealing resin 90 (FIG. 7E). For example, the external connection terminals 91 are formed by performing a reflow treatment after solder balls containing SnAg for example are loaded at the top of the columnar electrodes 35. In addition, the external connection terminals 91 may also be formed by performing the reflow treatment after a conductor paste containing SnAg for example is formed at the top of the columnar electrodes 35 by screen printing.

According to the semiconductor device 1 of the embodiment of the disclosure and the manufacturing method thereof, the second semiconductor chip 102 includes the inner peripheral area R21 which is relatively thicker and the outer peripheral area R22 which is relatively thinner. That is, the thickness of the second semiconductor chip 102 gradually decreases from the inner peripheral side toward the outer periphery side, and there is a step structure on the side surface. In other words, the gap formed between the first semiconductor chip 101 and the second semiconductor chip 102 gradually widens from the inner peripheral side toward the outer periphery side. Accordingly, a width of a path by which the sealing resin 90 flows toward the gap 300 formed between the first semiconductor chip 101 and the second semiconductor chip 102 can be widened, and an inflow of the sealing resin 90 to the gap 300 can be promoted. Furthermore, the sealing resin 90 flows along the step structure formed on the side surface of the second semiconductor chip 102, and thereby the inflow of the sealing resin 90 to the gap 300 can be further promoted. Accordingly, the filling of the sealing resin 90 into the gap 300 can be promoted, and a risk that the sealing resin 90 is not filled in the gap 300 can be suppressed. Therefore, the side surface of the joining member 92 used in the joining between the first semiconductor chip 101 and the second semiconductor chip 102 can be thoroughly covered by the sealing resin 90, and the reliability in the joining between the first semiconductor chip 101 and the second semiconductor chip 102 can be improved.

Here, in general, when a semiconductor device including solder terminals such as solder balls is mounted on a printed substrate, the solder terminals are fixed by filling an underfill material into a gap formed between the semiconductor device and the printed substrate. Accordingly, reliability in the joining between the semiconductor device and the printed substrate is ensured.

On the other hand, a case is considered, in which the underfill material is filled into the gap 300 formed between the first semiconductor chip 101 and the second semiconductor chip 102 in the semiconductor device 1 of the embodiment. In the semiconductor device 1, the second semiconductor chip 102 is surrounded by the columnar electrodes 35. Intervals between the second semiconductor chip 102 and the columnar electrodes 35 are extremely narrow, and thus a nozzle of a dispenser for supplying the underfill material interferes with the columnar electrodes 35, and it is hard to dispose a leading end of the nozzle near the joining portion of the first semiconductor chip 101 and the second semiconductor chip 102. In other words, according to the semiconductor device 1 of the embodiment, it is considered that the filling of the underfill material into the gap 300 formed between the first semiconductor chip 101 and the second semiconductor chip 102 is hard.

However, according to the semiconductor device 1 of the embodiment, as described above, the filling of the sealing resin 90 into the gap 300 formed between the first semiconductor chip 101 and the second semiconductor chip 102 can be promoted, and thus the joining member 92 can be fixed without using the underfill material, and the reliability in the joining between the first semiconductor chip 101 and the second semiconductor chip 102 can be improved.

In addition, the sealing resin 90 functions as a sealing member which seals the first semiconductor chip 101 and the second semiconductor chip 102, and also functions as a reinforcing member which reinforces mechanical strength of the joining member 92 by being filled into the gap 300 formed between the first semiconductor chip 101 and the second semiconductor chip 102 to cover the side surface of the joining member 92. Therefore, compared with a case that the reinforcing member such as the underfill material different from the sealing resin 90 is separately filled into the gap 300 formed between the first semiconductor chip 101 and the second semiconductor chip 102, a process number can be reduced. That is, according to the semiconductor device 1 of the embodiment, a multi-chip WL-CSP having high reliability can be manufactured at low cost.

Second Embodiment

Figure 8:
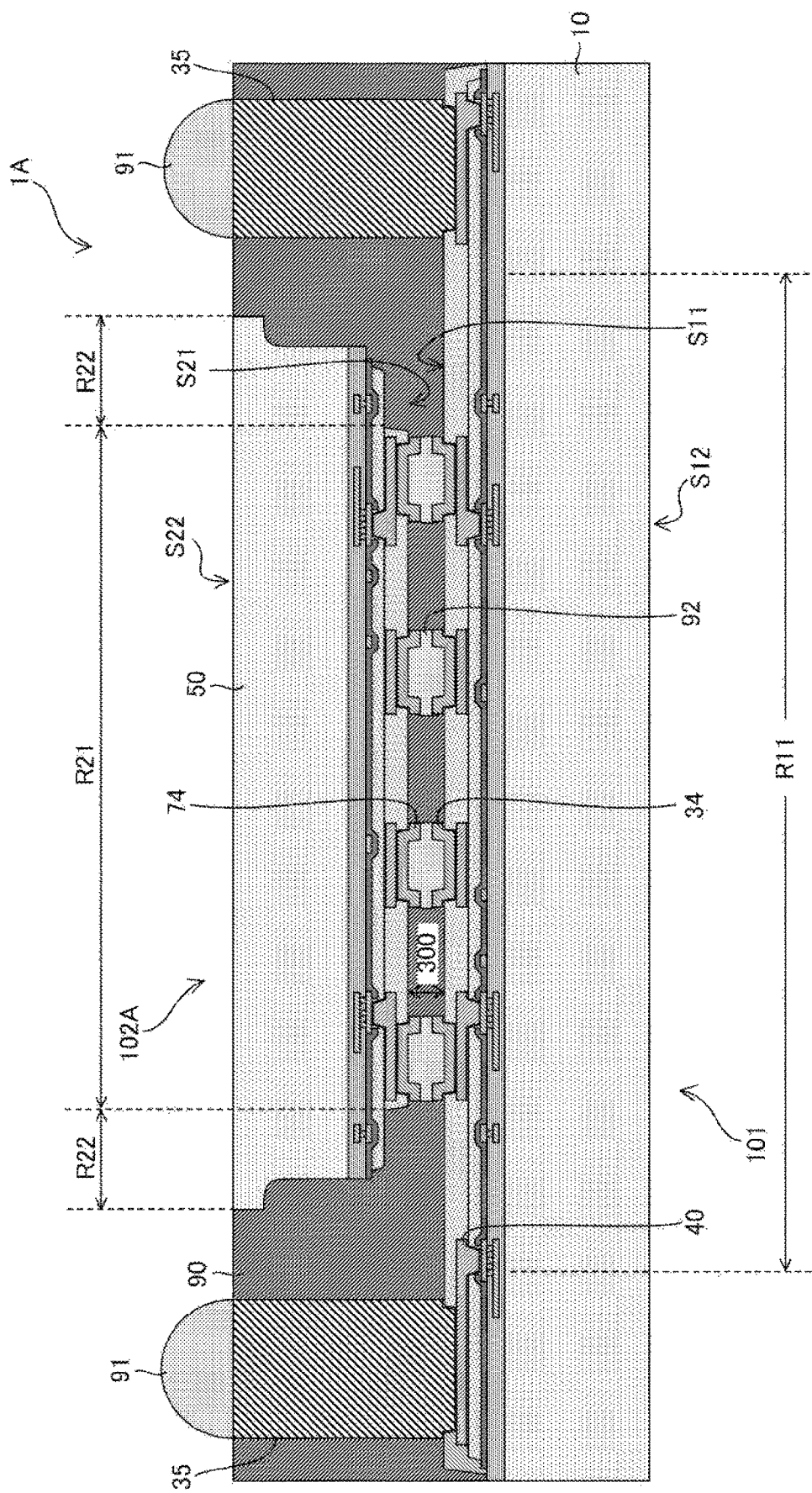
FIG. 8 is a cross-sectional view illustrating one example of a configuration of a semiconductor device of another embodiment of the disclosure.
Figure 9:
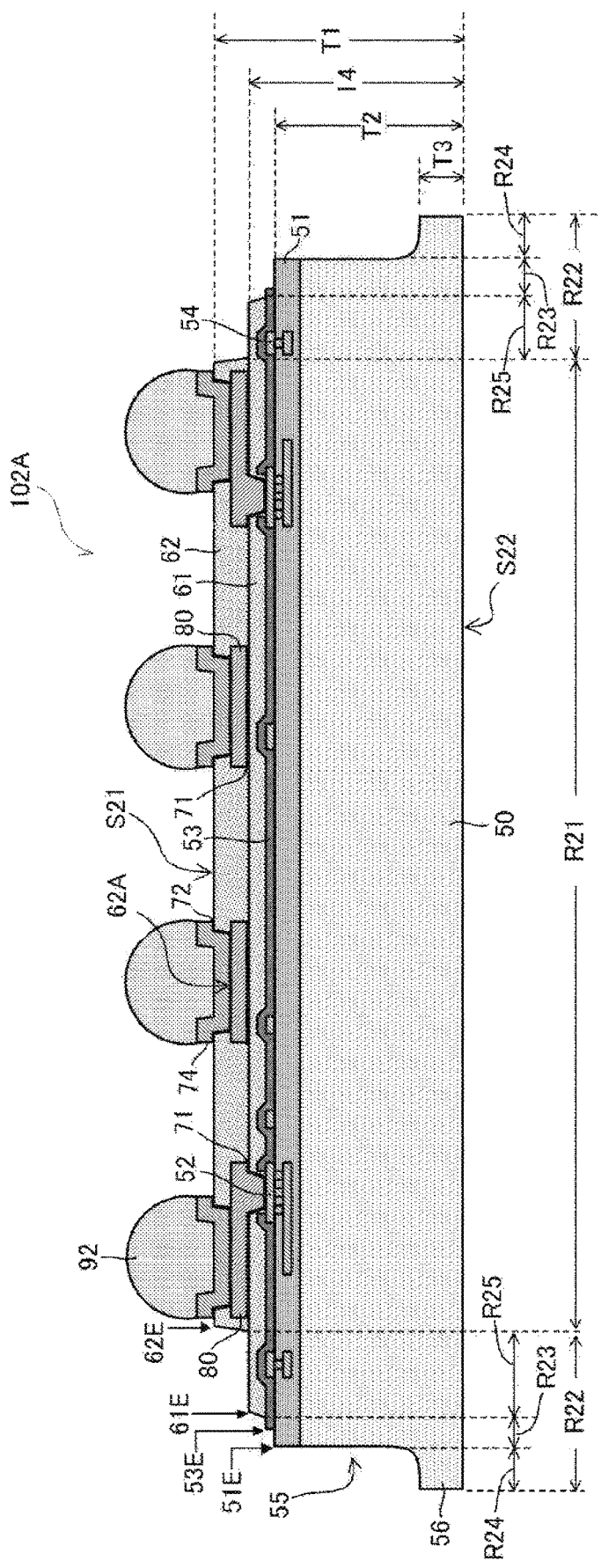
FIG. 9 is a cross-sectional view illustrating one example of a configuration of a second semiconductor chip of another embodiment of the disclosure.

FIG. 8 is a cross-sectional view illustrating a configuration of a semiconductor device 1A of a second embodiment of the disclosure. FIG. 9 a cross-sectional view illustrating a configuration of a second semiconductor chip 102A of the second embodiment of the disclosure which constitutes the semiconductor device 1A.

In the second semiconductor chip 102A of the second embodiment, the position of the end portion 62E of the upper-layer insulation film 62 is different from that of the second semiconductor chip 102 of the first embodiment. That is, in the second semiconductor chip 102A, the end portion 53E of the passivation film 53 is disposed closer to an inner peripheral side of the second semiconductor chip 102A than the end portion 51E of the interlayer insulation film 51. The end portion 61E of the lower-layer insulation film 61 is disposed closer to the inner peripheral side of the second semiconductor chip 102A than the end portion 53E of the passivation film 53. The end portion 62E of the upper-layer insulation film 62 is disposed closer to the inner peripheral side of the second semiconductor chip 102A than the end portion 61E of the upper-layer insulation film 61. That is, in the second semiconductor chip 102A, the end portion 61E of the upper-layer insulation film 61 is a structure exposed from the upper-layer insulation film 62.

Here, a range in which the upper-layer insulation film 62 of the second semiconductor chip 102A extends is defined as an inner peripheral area R21, and an area surrounding the inner peripheral area R21 of the second semiconductor chip 102A is defined as an outer peripheral area R22. Furthermore, a range in the outer peripheral area R22, in which the interlayer insulation film 51 extends and the interlayer insulation film 61 does not extends, is defined as a first outer peripheral area R23, a range in the outer peripheral area R22 in which the interlayer insulation film 61 extends is defined as a second outer peripheral area R25, and an area surrounding the first outer peripheral area R23 is defined as an outermost peripheral area R24. The inter-chip joining electrodes 74 are arranged in the inner peripheral area R21.

The second semiconductor chip 102A includes, in the inner peripheral area R21, the semiconductor substrate 50, the interlayer insulation film 51, the lower-layer insulation film 61 and the upper-layer insulation film 62. In the second outer peripheral area R25, the second semiconductor chip 102A does not include the upper-layer insulation film 62, but includes the lower-layer insulation film 61, the semiconductor substrate 50 and the interlayer insulation film 51. In the first outer peripheral area R23, the second semiconductor chip 102A does not include the upper-layer insulation film 62 or the lower-layer insulation film 61, but includes the semiconductor substrate 50 and the interlayer insulation film 51. In the outermost peripheral area R24, the second semiconductor chip 102A does not include the interlayer insulation film 51, the lower-layer insulation film 61 or the upper-layer insulation film 62, but includes the semiconductor substrate 50 (the projection portion 56).

A thickness T1 in the inner peripheral area R21 of the second semiconductor chip 102A is equivalent to a distance from the back surface S22 of the semiconductor substrate 50 to the surface of the upper-layer insulation film 62 and is, for example, about 200-250 μm. A thickness T2 in the first outer peripheral area R23 of the second semiconductor chip 102A is equivalent to a distance from the back surface S22 of the semiconductor substrate 50 to the surface of the interlayer insulation film 51 and is, for example, about 180-230 μm. A thickness T3 in the outermost peripheral area R24 of the second semiconductor chip 102A is equivalent to a thickness of the projection portion 56 of the semiconductor substrate 50 and is, for example, about 40-60 μm. A thickness T4 in the second outer peripheral area R25 of the second semiconductor chip 102A is equivalent to a distance from the back surface S22 of the semiconductor substrate 50 to the surface of the lower-layer insulation film 61 and is, for example, about 190-240 μm. Besides, T3<T2<T4<T1 is always established. A depth of the concave portion 55 of the semiconductor substrate 50 in a thickness direction of the semiconductor substrate 50 is, for example, about 120-190 μm.

Accordingly, the thickness of the second semiconductor chip 102A gradually increases from the inner peripheral side toward the outer periphery side. In other words, the second semiconductor chip 102A has a step structure in which a position of the end portion in the direction parallel to the principle surface changes along the thickness direction of the second semiconductor chip 102A, and the gap formed between the first semiconductor chip 101 and the second semiconductor chip 102A gradually widens from the inner peripheral side toward the outer periphery side.

A width in the first outer peripheral area R23 of the second semiconductor chip 102A is equivalent to a distance from an end surface of the concave portion 55 of the semiconductor substrate 50 to the end portion 61E of the lower-layer insulation film 61 and is, for example, about 5-20 μm. A width in the second outer peripheral area R25 of the second semiconductor chip 102A is equivalent to a distance from the end portion 61E of the lower-layer insulation film 61 to the end portion 62E of the upper-layer insulation film 62 and is, for example, about 5-10 μm.

According to the semiconductor device 1A of the second embodiment, similar to the semiconductor device 1 of the first embodiment, the filling of the sealing resin 90 into the gap 300 formed between the first semiconductor chip 101 and the second semiconductor chip 102A can be promoted. Accordingly, the side surface of the joining member 92 used in the joining between the first semiconductor chip 101 and the second semiconductor chip 102A can be thoroughly covered by the sealing resin 90, and the reliability in the joining between the first semiconductor chip 101 and the second semiconductor chip 102A can be improved.

Here, in general, by reducing the element formation area and the scribe line dividing the element formation area, the number of the semiconductor chips obtained from one piece of semiconductor wafer can be increased. For example, by reducing a width of the scribe line on which the circuit element is not formed, the number of the semiconductor chips obtained from one piece of semiconductor wafer can be increased without reducing the circuit element. However, when the width of the scribe line is reduced, it is hard to ensure an area in which the lower-layer insulation film is covered by the upper-layer insulation film.

Therefore, by a configuration in which the end portion of the upper-layer insulation film is disposed on the surface of the lower-layer insulation film, the rewire layer can be covered by the upper-layer insulation film even in the semiconductor chip in which the width of the scribe line is reduced, and a problem that corrosion is generated due to the exposure of the rewire layer to the atmosphere and the long-term reliability is degraded can be solved. In addition, the uppermost-layer wire at the end portion of the chip is protected by the passivation film, and thus it is unnecessary to cover the passivation film on the uppermost-layer wire by the lower-layer insulation film in a general WL-CSP provided with the upper-layer insulation film.

However, due to a form in which the upper-layer insulation film is sealed by the sealing resin in the semiconductor chip constituting the multi-chip WL-CSP, there is a concern that in the uppermost-layer wire is only covered by the passivation film, which is disposed in an area exposed from the lower-layer insulation film covered by the upper-layer insulation film, especially on the outer periphery side of the chip electrode, a defect such as a disconnection is generated due to a filler attack caused by the sealing resin.

In the second semiconductor chip 102A of the embodiment, the uppermost-layer wire 54 arranged on the uppermost layer within a plurality of wire layers is arranged closer to the outer periphery side of the second semiconductor chip 102A than the chip electrodes 52. The uppermost-layer wire 54 is covered by the passivation film 53 and the lower-layer insulation film 61. Accordingly, by covering the uppermost-layer wire 54 by the passivation film 53 and the lower-layer insulation film 61, and a risk of generating the defect such as the disconnection caused by the filler attack can be suppressed compared with a case that the uppermost-layer wire 54 is only covered by the passivation film 53. Accordingly, the long-term reliability of the multi-chip WL-CSP can be ensured.

Besides, the inter-chip joining electrode 34 is one example of the first electrode in the disclosure. The inter-chip joining electrode 74 is one example of the second electrode in the disclosure. The interlayer insulation film 51 is one example of the first insulation film in the disclosure. The lower-layer insulation film 61 is one example of the second insulation film in the disclosure. The upper-layer insulation film 62 is one example of the third insulation film in the disclosure.

What is claimed is:

1. A semiconductor device, comprising:
 a first semiconductor chip, which has a plurality of first electrodes on a surface of the first semiconductor chip;
 a second semiconductor chip, which is disposed to be separated by a gap from the surface of the first semiconductor chip, and which comprises an inner peripheral area that has a plurality of second electrodes connected to each of the plurality of first electrodes on a surface of the second semiconductor chip and an outer peripheral area that surrounds the inner peripheral area and has a thickness thinner than a thickness of the inner peripheral area; and
 a sealing resin, which is respectively filled between the surface of the first semiconductor chip and the inner peripheral area, and between the surface of the first semiconductor chip and the outer peripheral area,
 wherein the outer peripheral area comprises:
  a first outer peripheral area having a thickness thinner than the thickness of the inner peripheral area,
  an outermost peripheral area that surrounds the first outer peripheral area and has a thickness thinner than the thickness of the first outer peripheral area, and
  a second outer peripheral area, which is located between the inner peripheral area and the first outer peripheral area, and which has a thickness that is thinner than the thickness of the inner peripheral area but is thicker than the thickness of the first outer peripheral area,
 the second semiconductor chip has a plurality of wire layers; an uppermost-layer wire, which is disposed as an uppermost layer within the plurality of wire layers disposed on a first insulation layer of the second outer peripheral area, is covered by a second insulation layer formed on the first insulation layer; and a surface of the second insulation layer of the second outer peripheral area is exposed from a third insulation layer formed on the second insulation layer.

2. The semiconductor device according to claim 1, comprising a joining member which joins each of the plurality of first electrodes and each of the plurality of second electrodes, wherein a side surface of the joining member is covered by the sealing resin.

3. The semiconductor device according to claim 1, wherein the first semiconductor chip has a plurality of columnar electrodes surrounding the second semiconductor chip in a plan view; and the sealing resin is filled between each of the columnar electrodes and the second semiconductor chip.

4. The semiconductor device according to claim 1, wherein the second semiconductor chip comprises a concave portion that is concaved to an inner peripheral side of the second semiconductor chip on a side surface intersecting with a surface on which the plurality of second electrodes are arranged.

5. The semiconductor device according to claim 1, wherein a thickness of the second semiconductor chip in the inner peripheral area is three times or more than the thickness of the second semiconductor chip in the outermost peripheral area.

6. The semiconductor device according to claim 3, wherein a portion of the sealing resin filled between the first semiconductor chip and the second semiconductor chip and a portion of the sealing resin filled between each of the columnar electrodes and the second semiconductor chip comprise fillers of the same size.

7. The semiconductor device according to claim 1, wherein a thickness of the second semiconductor chip gradually decreases from an inner peripheral side toward an outer periphery side.

* * * * *